United States Patent
Azaria et al.

(10) Patent No.: US 11,638,938 B2
(45) Date of Patent: May 2, 2023

(54) IN SITU PROCESS CHAMBER CHUCK CLEANING BY CLEANING SUBSTRATE

(71) Applicant: KLA Corporation, Milpitas, CA (US)

(72) Inventors: Mor Azaria, Migdal Ha'emek (IL); Giampietro Bieli, Santa Clara, CA (US); Shai Mark, Kibutz Snir (IL); Adi Pahima, Migdal Ha'emek (IL); Yoram Uziel, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 325 days.

(21) Appl. No.: 16/682,814

(22) Filed: Nov. 13, 2019

(65) Prior Publication Data

US 2020/0384509 A1 Dec. 10, 2020

Related U.S. Application Data

(60) Provisional application No. 62/910,139, filed on Oct. 3, 2019, provisional application No. 62/859,587, filed on Jun. 10, 2019.

(51) Int. Cl.
  *B08B 6/00* (2006.01)
  *H01L 21/687* (2006.01)
  *B08B 3/08* (2006.01)

(52) U.S. Cl.
  CPC .............. *B08B 6/00* (2013.01); *B08B 3/08* (2013.01); *H01L 21/687* (2013.01)

(58) Field of Classification Search
  CPC .... C23C 16/4401; G03F 7/70908; B08B 6/00
  See application file for complete search history.

(56) References Cited

U.S. PATENT DOCUMENTS

| | | | |
|---|---|---|---|
| 5,622,413 A | 4/1997 | Kim et al. | |
| 8,559,001 B2 | 10/2013 | Chang et al. | |
| 8,749,149 B2 | 6/2014 | Naruo et al. | |
| 8,941,336 B1 | 1/2015 | Liu et al. | |
| 9,170,209 B1 | 10/2015 | Chang et al. | |
| 10,177,020 B2 | 1/2019 | Brain | |
| 2006/0288518 A1* | 12/2006 | Lenkiwicz | A47L 11/34 15/322 |
| 2010/0170533 A1* | 7/2010 | Terada | B82Y 40/00 15/159.1 |
| 2015/0261104 A1 | 9/2015 | Kamo et al. | |
| 2017/0136500 A1* | 5/2017 | Humphrey | B24B 37/34 |

(Continued)

FOREIGN PATENT DOCUMENTS

| | | |
|---|---|---|
| DE | 102015204521 A1 * | 10/2016 |
| KR | 1019980005735 | 3/1998 |

(Continued)

OTHER PUBLICATIONS

Machine translation: DE102015204521; Bischoff et al. (Year: 2016).*

(Continued)

*Primary Examiner* — Natasha N Campbell
(74) *Attorney, Agent, or Firm* — Suiter Swantz pc llo

(57) ABSTRACT

A cleaning assembly is disclosed. The cleaning assembly includes a substrate. One or more patterns are formed on a bottom side of the substrate. One or more structures within the one or more patterns attract one or more particles from a chuck via at least one of electrostatic attraction or mechanical trapping when the substrate is positioned on the chuck.

18 Claims, 18 Drawing Sheets

(56) References Cited

U.S. PATENT DOCUMENTS

2019/0295874 A1 9/2019 Bieli et al.
2020/0126752 A1 4/2020 Brodie
2021/0026338 A1 1/2021 Yati

FOREIGN PATENT DOCUMENTS

| KR | 1020060006305 A | 1/2006 |
| KR | 1020090012703 A | 2/2009 |
| KR | 101535785 B1 | 7/2015 |

OTHER PUBLICATIONS

PCT International Search Report and Written Opinion for International Application No. PCT/US2020/036724 dated Sep. 21, 2020, 11 pages.

* cited by examiner

IN SITU PROCESS CHAMBER CHUCK CLEANING BY CLEANING SUBSTRATE

CROSS-REFERENCE TO RELATED APPLICATION

The present application claims the benefit under 35 U.S.C. § 119(e) of U.S. Provisional Application Ser. No. 62/859,587, filed Jun. 10, 2019, entitled IN SITU PROCESS CHAMBER CHUCK CLEANING BY DUMMY SUBSTRATE, naming Mor Azaria, Giampietro Bieli, Shai Mark, Adi Pahima, and Yoram Uziel as inventors, which is incorporated herein by reference in the entirety. The present application also claims the benefit under 35 U.S.C. § 119(e) of U.S. Provisional Application Ser. No. 62/910,139, filed Oct. 3, 2019, entitled IN-SITU PROCESS CHAMBER CHUCK CLEANING BY CLEANING SUBSTRATE, naming Mor Azaria, Giampietro Bieli, Shai Mark, Adi Pahima, and Yoram Uziel as inventors, which is incorporated herein by reference in the entirety.

TECHNICAL FIELD

The present invention generally relates to chuck cleaning, and, more particularly, to in-situ process chamber chuck cleaning.

BACKGROUND

Chuck cleaning is frequently required due to the presence of particles in process chambers. These particles may be introduced into the process chamber in a variety of ways. Contaminant particles may be created through the accumulation of materials used by the process tool on the walls of the process chamber. Particulate matter from this material may then fall from the process chamber walls during processing. In addition, outside particles may be carried into a process chamber on an outside object such as a wafer. The particles cause the wafer to have non-uniform contact with the process chuck of the given process tool, which causes non-uniform temperature levels across the wafer during processing. Currently, chuck cleaning is performed by opening the equipment and using manual cleaning processes. Often the chuck is manually cleaned using a tissue or brush. In such cases, the cleaning process requires a machine shutdown, purging of the vacuum, and cooling down of the equipment. Additionally, access to the chuck is very limited and it is likely that the process chamber cover will need to be opened in order to reach the wafer chuck of the given process tool. This manual cleaning process and machine setup process is a long process and often requires a complex calibration process.

As such, it would be advantageous to provide a system and method to remedy the shortcomings of the conventional approaches identified above.

SUMMARY

A cleaning assembly is disclosed, in accordance with one or more embodiments of the present disclosure. In one embodiment, the cleaning assembly includes a substrate. In another embodiment, one or more patterns are formed on a bottom side of the substrate. In another embodiment, one or more structures within the one or more patterns attract one or more particles from a chuck via at least one of electrostatic attraction or mechanical trapping when the substrate is positioned on the chuck.

A system is disclosed, in accordance with one or more embodiments of the present disclosure. In one embodiment, the system includes a process chamber. The process chamber may contain one or more chucks. In another embodiment, the system includes a handling device. The handling device may be configured to receive a cleaning substrate cabinet containing one or more cleaning substrates. The handling device may further be configured to translate the one or more cleaning substrates from the cleaning substrate cabinet to the one or more wafer chucks within the process chamber. In another embodiment, one or more patterns are formed on a bottom side of the one or more cleaning substrates. In another embodiment, one or more structures within the one or more patterns attract one or more particles from the one or more wafer chucks via at least one of electrostatic attraction or mechanical trapping when the one or more cleaning substrates are positioned on the one or more wafer chucks.

A characterization system is disclosed, in accordance with one or more embodiments of the present disclosure. In one embodiment, the characterization system includes a characterization sub-system. The characterization sub-system may be configured to inspect a portion of a wafer arranged on a chuck of a process tool. The characterization sub-system may further be configured to generate characterization data based on the inspection of the portion of the wafer arranged on the chuck of the process tool. In another embodiment, the characterization system includes a controller including one or more processors configured to receive the inspection data from the characterization sub-system. In another embodiment, the characterization system includes the controller including the one or more processors configured to determine, based on the characterization data, one or more cleaning parameters. In another embodiment, the characterization system includes the controller including the one or more processors configured to direct one or more robotic assemblies to position a cleaning substrate to the chuck of the process tool.

A method is disclosed, in accordance with one or more embodiments of the present disclosure. In one embodiment, the method may include providing a cleaning substrate in a cleaning substrate cabinet. In another embodiment, the method may include moving the cleaning substrate from the cleaning substrate cabinet onto a wafer chuck contained within a process chamber via a handling device. In another embodiment, the method may include cleaning a surface of the wafer chuck with the cleaning substrate, wherein one or more patterns are formed on a bottom side of the cleaning substrate. In another embodiment, one or more structures within the one or more patterns attract one or more particles from the chuck via at least one of electrostatic attraction or mechanical trapping when the cleaning substrate is positioned on the chuck.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Referring generally to FIGS. 1-11, an in-situ chuck cleaning system and method is described, in accordance with one or more embodiments of the present disclosure.

Embodiments of the present disclosure are directed to an in-situ chuck cleaning system and method for cleaning process tool chucks. More particularly, the present disclosure is directed to a cleaning substrate suitable for cleaning process tool chucks. The cleaning substrate may include one or more patterns formed on the surface of the cleaning substrate that attract the particles from a process tool chuck using at least one of electrostatic attraction, mechanical trapping, or the like. Embodiments of the present disclosure are also directed to characterization-triggered cleaning of the process tool chucks.

Figure 1:
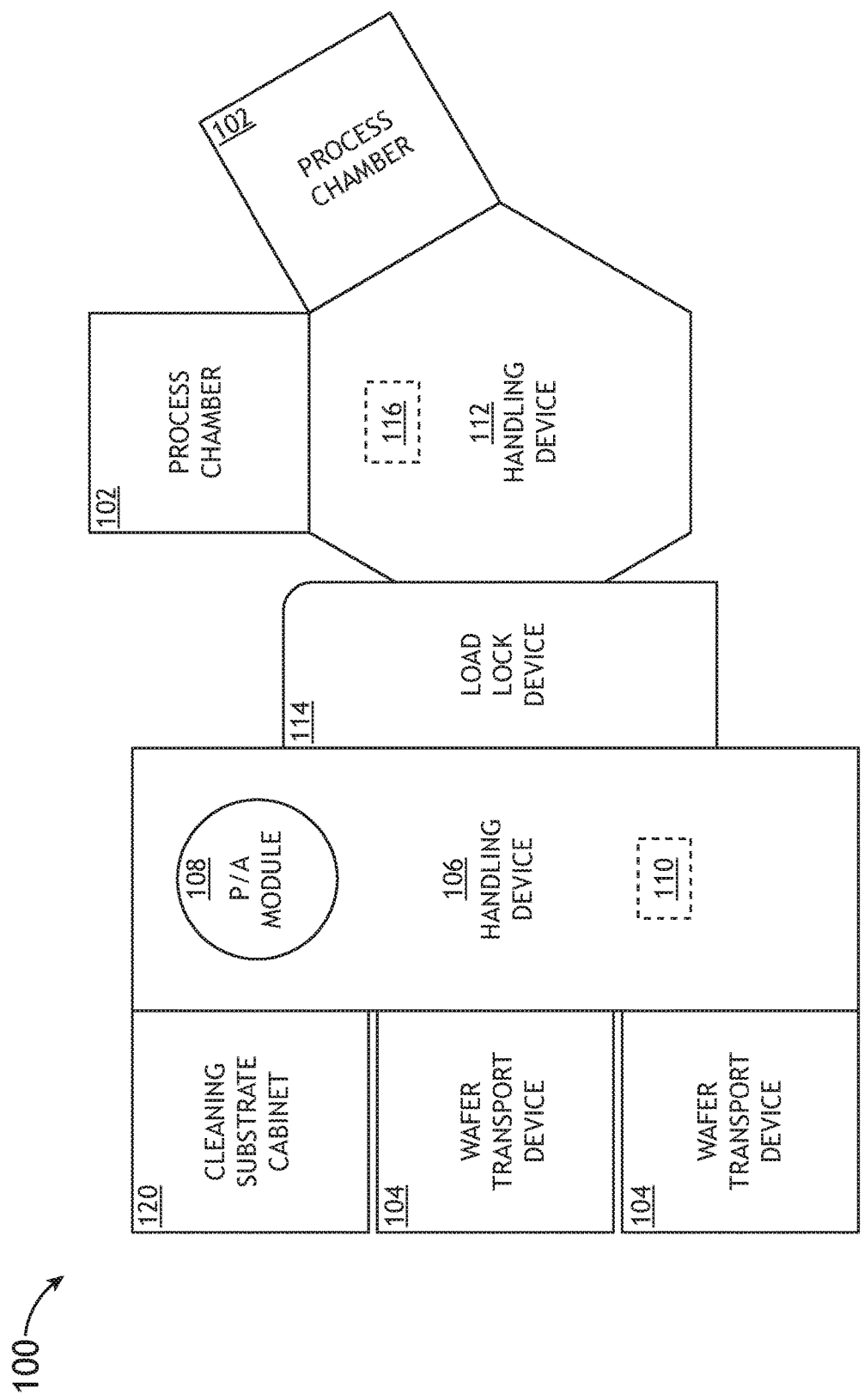
FIG. 1 illustrates a simplified schematic view of a wafer processing system, in accordance with one or more embodiments of the present disclosure.

FIG. 1 illustrates a wafer processing system 100, in accordance with one or more embodiments of the present disclosure. In one embodiment, the processing system 100 includes one or more process chambers 102 configured to perform one or more semiconductor fabrication processes. For example, the one or more semiconductor fabrication processes may include, but are not limited to, one or more lithographic processes such as substrate preparation, spin coating, pre-bake processes, exposure processes, post-exposure baking processes, development processes, post-bake processes, or the like. For instance, the one or more lithographic processes may include, but are not limited to, patterning processes, etching processes, stripping processes, annealing processes, chemical mechanical planarization (CMP) processes, or the like. By way of another example, the one or more semiconductor fabrication processes may include, but are not limited to, one or more film deposition processes. For example, the one or more film deposition processes may include, but are not limited to, chemical vapor deposition (CVD) processes, physical vapor deposition (PVD) processes, or the like. It is noted herein that the processing system 100 may include one or more process chambers 102 with the same capabilities (e.g., perform the same fabrication process) in order to enhance the throughput or one or more process chambers 102 with different capabilities (e.g., perform different fabrication processes).

In another embodiment, the processing system 100 includes one or more wafer transport devices 104 (e.g., front opening universal pods (FOUPs)) configured to carry a wafer lot. It is noted herein that, for the purposes of the present disclosure, the terms "FOUP" and "wafer transport device" may be used interchangeably, unless noted otherwise herein. A description of the use of a wafer transport device is described in U.S. Patent Publication No. 2019/0295874, published Sep. 26, 2019, which is incorporated herein by reference in the entirety. Additionally, a description of the use of a wafer transport device is described in U.S. Pat. No. 10,177,020, issued on Jan. 8, 2019, which is incorporated herein by reference in the entirety.

In another embodiment, the processing system 100 includes a handling device 106. For example, the handling device 106 may be configured to receive the cleaning substrate cabinet 120 containing the one or more cleaning substrates 216. By way of another example, the handling device 106 may also be configured to receive the one or more FOUPs 104 containing the wafer lot (e.g., wafers 210). In another embodiment, the handling device 106 includes a robotic assembly 110 configured to extract at least one of the wafer 210 from the wafer lot of the FOUP 104 or the cleaning substrate 216 from the cleaning substrate cabinet 120. The processing system 100 may include any handling device 106 known in the art. For example, the processing system 100 may include an atmospheric handling device. For instance, the atmospheric handling device may be at or near atmospheric pressure. By way of another example, the processing system 100 may include a vacuum handling device. For instance, the vacuum handling device may be at or near vacuum pressure. For purposes of the present disclosure, "vacuum pressure" is interpreted to mean any pressure that is lower than atmospheric pressure.

In another embodiment, the cleaning substrate cabinet 120 is configured to prepare the one or more cleaning substrates 216 for operation (e.g., cleaning the process chuck 212). For example, the cleaning substrate cabinet 120 may prepare different cleaning substrates based on one or more parameters (e.g., particle size, particle material, or the like). For instance, the cleaning substrate cabinet 120 may prepare a first cleaning substrate 216 to be used to remove a first particle 214 on a first wafer 210. In a further instance, the cleaning substrate cabinet 120 may prepare an additional cleaning substrate 216 to be used to remove an additional particle 214 on the first wafer 210 and/or an additional wafer 210.

In another embodiment, the cleaning substrate cabinet 120 is configured to clean the cleaning substrate 216, such that the cleaning substrate 216 can be configured for multiple cleaning cycles. For example, the cleaning substrate cabinet 120 may clean the cleaning substrate 216 using either wet- or dry-cleaning methods. For instance, the cleaning substrate cabinet 120 may utilize a dry-cleaning method such as carbon dioxide ($CO_2$) snow cleaning. In a further instance, the cleaning substrate cabinet 120 may utilize a wet cleaning method such as mega sonic cleaning.

As used through the present disclosure, the term "wafer" refers to a substrate formed of a semiconductor and/or a non-semi-conductor material. For instance, a semiconductor or semiconductor material may include, but is not limited to, monocrystalline silicon, gallium arsenide, and indium phosphide. Therefore, the above description should not be interpreted as a limitation on the scope of the present disclosure but merely an illustration.

In another embodiment, the processing system 100 includes a pre-alignment (P/A) module 108 configured to align an orientation of the wafer 210 or the cleaning substrate 216. For example, the P/A module 108 may include one or more optical sensors configured to detect a notch on a surface (e.g., top side or bottom side) the wafer 210 or the cleaning substrate 216. After the notch is detected, the P/A module 108 may position the center of the wafer 210 or the center of the cleaning substrate 216 using any algorithm known in the art.

In another embodiment, the processing system 100 includes a load lock device 114 configured to receive at least one of the wafer 210 or the cleaning substrate 216. The load lock device 114 may include any load lock device 114 known in the art, including but not limited to, a vacuum load lock device, an atmospheric load lock device, or the like. For example, the load lock device 114 may be an atmospheric load lock device 114. For instance, the atmospheric load lock device 114 may be configured to receive at least one of the wafer 210 or the cleaning substrate 216 while at or near atmospheric pressure (14.696 psi).

In another embodiment, the load lock device 114 containing at least one of the wafer 210 or the cleaning substrate 216 is configured to receive air until a sufficient pressure level is achieved. For example, the load lock device 114 may be configured to receive air until the load lock device 114 reaches a high vacuum pressure (e.g., $10^{-5}$ to $10^{-8}$).

Figure 2A:
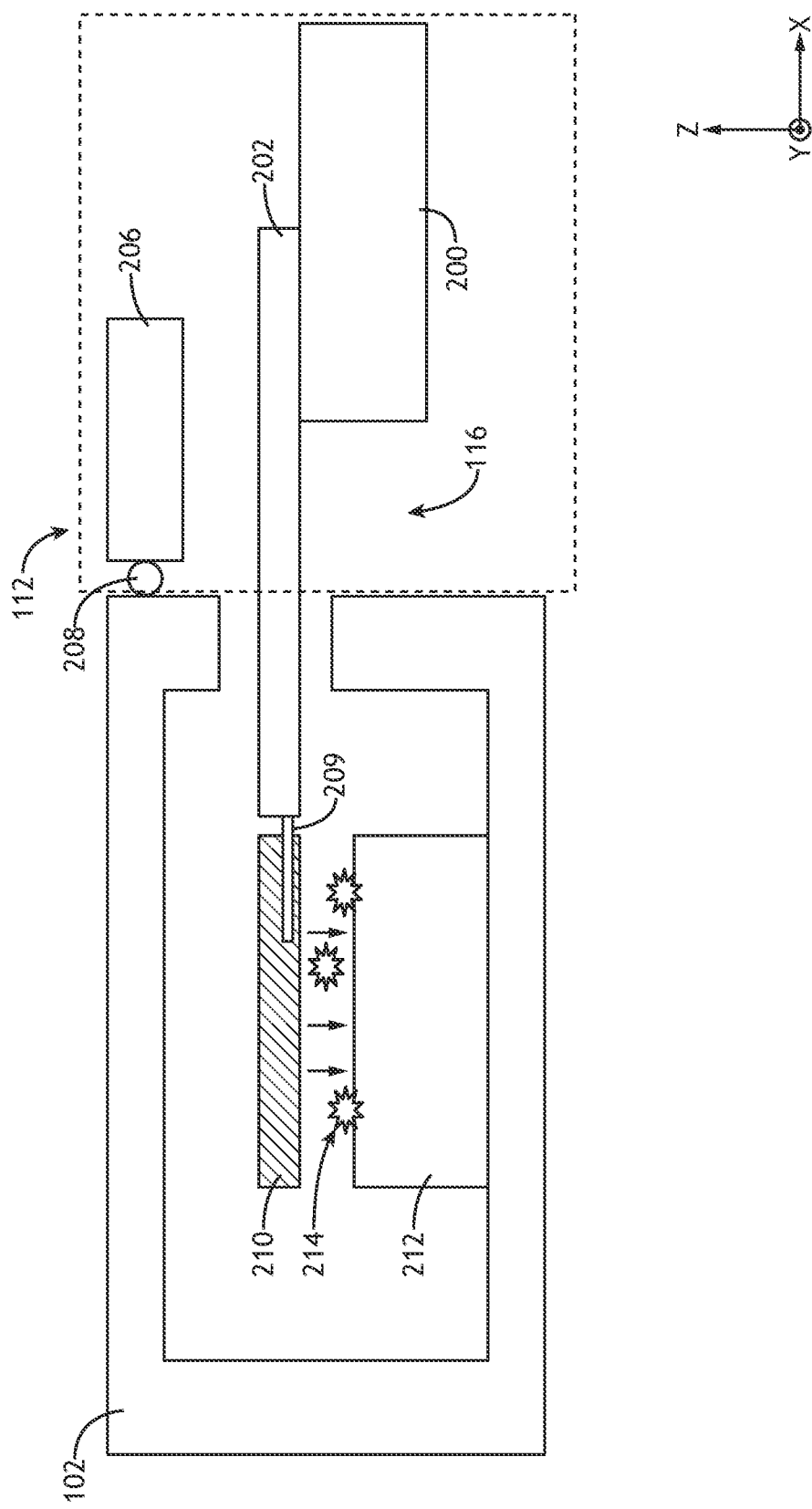
FIG. 2A illustrates a simplified schematic view of a process chamber depicting processing of a wafer, in accordance with one or more embodiments of the present disclosure.
Figure 2B:
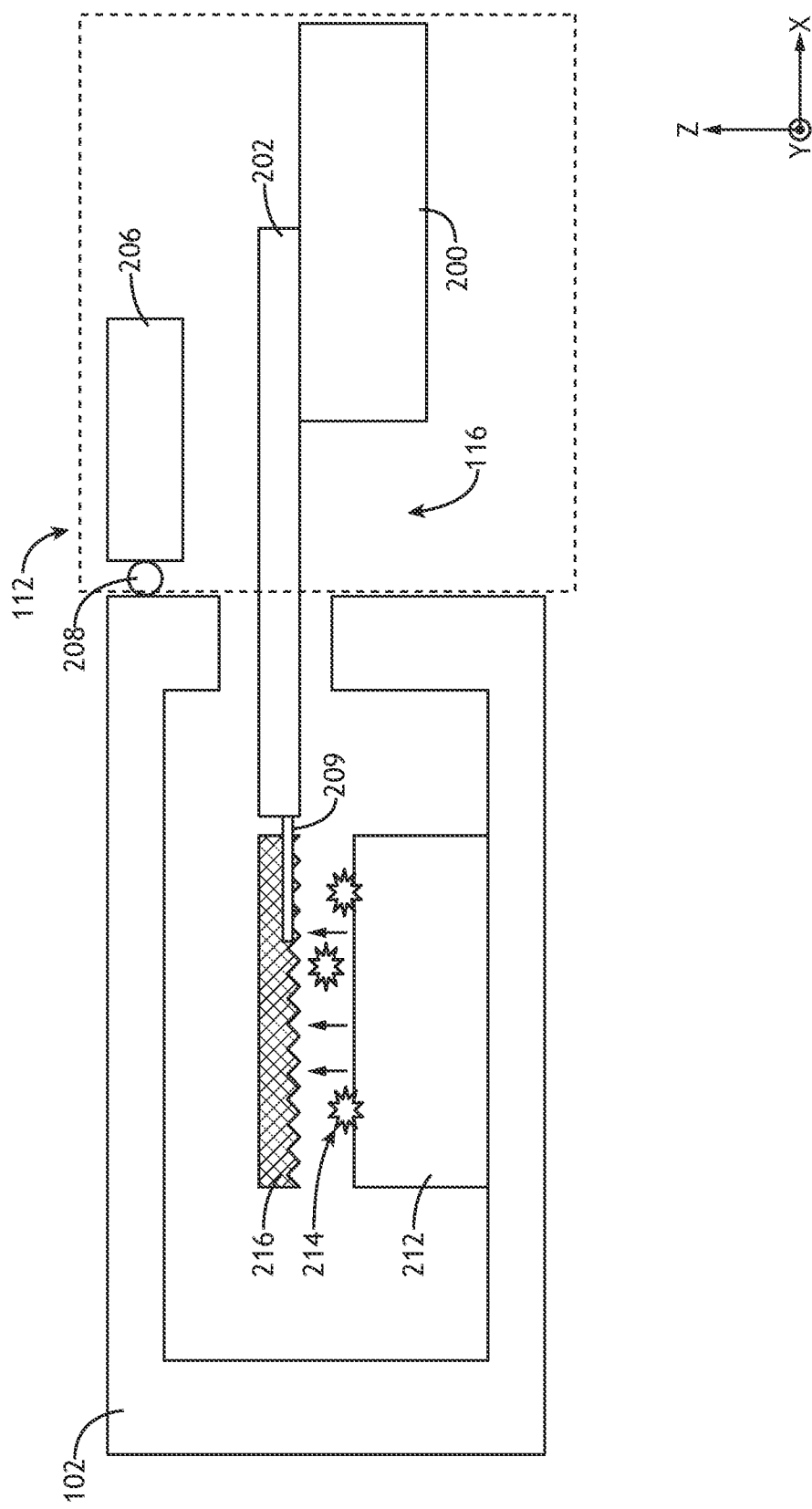
FIG. 2B illustrates a simplified schematic view of a process chamber depicting the incorporation of a cleaning assembly, in accordance with one or more embodiments of the present disclosure.

FIG. 2A illustrates a simplified schematic view of the process chamber 102 depicting processing of the wafer 210, in accordance with one or more embodiments of the present disclosure. FIG. 2B illustrates a simplified schematic view of the process chamber 102 depicting the incorporation of the cleaning assembly 300, in accordance with one or more embodiments of the present disclosure.

In another embodiment, the processing system 100 includes a handling device 112 configured to transport (e.g., deliver) at least one of the wafer 210 or the cleaning substrate 216 to a chuck 212 in the one or more process chambers 102 via a robotic assembly 116.

In another embodiment, the robotic assembly 116 includes a robot 200 and an end effector 202. Although not shown, the robotic assembly 110 may also include a robot and an end effector. It is noted herein that the robotic assemblies 110, 116 may include any type of robot known in the art. For example, the robotic assemblies 110, 116 may include at least one of an atmospheric robot or a vacuum robot. For instance, the robotic assemblies 110, 116 may include at least one of an atmospheric internal rotary robot or a vacuum internal rotary robot.

It is noted herein that various systems and subsystems within the processing system 100 may share any number of components. For example, the system 100 may share one or more components of the one or more robotic assemblies 110, 116. By way of another example, the system 100 may share one or more components of the handling devices 106, 112.

In another embodiment, the end effector 202 includes an edge gripper 209 configured to interact with at least one of the wafer 210 (FIG. 2A) or the cleaning substrate 216 (FIG. 2B) in order to remove at least one of the wafer 210 or the cleaning substrate 216 from the handling device 112 and insert at least one of the wafer 210 or the cleaning substrate 216 into the one or more process chambers 102. For example, the edge gripper 209 may be configured to insert the wafer 210 into the one or more process chambers 102, such that the one or more process chambers 102 can begin the one or more semiconductor fabrication processes. By way of another example, the edge gripper 209 may be configured to insert the cleaning substrate 216 into the one or more process chambers 102 after the chuck 212 contains one or more particles 214 to begin the cleaning processes described herein.

It is noted herein that although FIG. 2A depicts the wafer 210 depositing the one more particles 214 onto the chuck 212, such depiction is provided merely for illustrative purposes and shall not be construed as limiting the scope of the present disclosure. For example, one or more walls of the process chamber 102 may deposit the one or more particles 214 onto the chuck 212.

In another embodiment, the robotic assembly 116 is configured to remove at least one of the wafer 210 or the cleaning substrate 216 from the one or more process chambers 102. For example, the edge gripper 209 of the end effector 202 may be configured to remove at least one of the wafer 210 or the cleaning substrate 216. For instance, the edge gripper 209 may be configured to remove the wafer 210 from the one or more process chambers 102 after the one or more semiconductor fabrication processes are completed. In a further instance, the edge gripper 209 may be configured to remove the cleaning substrate 216 from the one or more process chambers 102 after the chuck 212 has been cleaned (discussed further in FIGS. 3A-3E).

In another embodiment, the handling device 112 includes a gate 206. In another embodiment, the gate 206 includes an actuator 208 configured to open and close the gate 206. For example, the actuator 208 may open the gate 206 when the robotic assembly 116 is prepared to remove and/or insert at least one of the wafer 210 or the cleaning substrate 216. By way of another example, the actuator 208 may close the gate 206 when the robotic assembly 116 is finished removing and/or inserting at least one of the wafer 210 or the cleaning substrate 216. It is noted herein that the gate 206 may include any actuator 208 known in the art. For example, the gate 206 may include a hydraulic actuator, an electrical actuator, a mechanical actuator, or the like.

In another embodiment, the processing system 100 returns at least one of the wafer 210 or the cleaning substrate 216 to the FOUP 104 using at least one of the robotic assembly 116 or the robotic assembly 110. For example, the processing system 100 may return the wafer 210 to the FOUP 104 via the robot assemblies 110, 116 before the cleaning substrate 216 is transported (e.g., delivered) to the one or more process chambers 102. For instance, the cleaning substrate 216 may be transported (e.g., delivered) to the one or more process chambers 102 after the wafer 210 is removed, such that the cleaning substrate 216 may remove the one or more particles 214 from the chuck 212 in the one or more process chambers 102.

It is noted herein that the conditions of the process chamber 102 may vary. For example, the process chamber 102 may have a temperature between 180° C. and 520° C. For instance, during chemical vapor deposition (CVD), the process chamber 102 may have a temperature between 420° C. and 520° C. In another instance, during etch, the process chamber 102 may have a temperature of at least 180° C. By way of another example, the process chamber 102 may have a vacuum level between 0 and 1.0 mTorr at base pressure. By way of another example, the process chamber 102 may have a vacuum level between 0.5 mTorr and 100 Torr at process pressure. For instance, during CVD, the process pressure may be 2.0-10.0 torr for 95% of the time and during 5% of the time it may be no more than 100 torr. In another instance, during etch, the process pressure may be 0.5-400 mTorr for 95% of the time and during 5% of the time it may be no more than 400 mTorr.

Further, it is noted herein that the process chamber 102 may be configured to hold any dimension of wafer and/or cleaning substrate. For example, the process chamber 102 may be configured to hold a wafer 210 and/or a cleaning substrate 216 that has a height between 1.0-10 mm. For instance, the wafer 210 and/or cleaning substrate 216 may have a height of 3.0 mm.

In one embodiment, the conditions of the process chamber 102 limit the amount of time the cleaning substrate 216 and/or the wafer 210 can be maintained inside the process chamber 102. For example, the temperature of the process chamber 102 may limit the amount of time the cleaning substrate 216 and/or the wafer 210 may be maintained inside the process chamber 102. The net radiated power (P) of the cleaning substrate 216 may be described by:

$$P = \in \sigma A_{s,r}(T_c^4 - T^4) \quad \text{Eqn. 1}$$

In Eqn. 1, $\in$ is the emissivity of the cleaning substrate; $\sigma$ is the Boltzmann constant ($5.67037 \times 10^{-8}$ watts/m$^2$K$^4$); $A_{s,r}$ is the area of the emitting body (e.g., the cleaning substrate 216); T is the temperature of the radiator (e.g., the cleaning substrate 216); and $T_c$ is the temperature of surroundings (e.g., the process chamber 102). The amount of heat energy gained or lost (Q) by the particle 214 may be described by:

$$Q = mC_p \Delta T \quad \text{Eqn. 2}$$

In Eqn. 2, m is the mass of the particle; $C_p$ is heat capacity of the particle; $\Delta T$ is the change in temperature of the particle. The transfer of heat by radiation (P) is equivalent to the amount of heat transferred (Q), as shown by:

$$\in \sigma A_{s,r}(T_c^4 - T^4) = mC_p \Delta T \quad \text{Eqn. 3}$$

$$t = \frac{mC_p}{4 \in A_{s,r} \sigma T_C^3}$$

$$\left\{ \ln\left|\frac{T_C + T}{T_C - T}\right| - \ln\left|\frac{T_C + T_i}{T_C - T_i}\right| + 2\left[\tan^{-1}\left(\frac{T}{T_C}\right) - \tan^{-1}\left(\frac{T_i}{T_C}\right)\right] \right\}$$

Solving Eqn. 3 and Eqn. 4 for t results in a time before failure (t) based on an approximate temperature of failure (e.g., 130° C.).

FIGS. 3A through 3E illustrate a cleaning assembly 300 include the cleaning substrate 216, in accordance with one or more embodiments of the present disclosure. In one embodiment, the cleaning assembly 300 includes the cleaning substrate 216 (as shown in FIGS. 2A and 2B). For example, the cleaning substrate 216 may include a ceramic wafer. By way of another example, the cleaning substrate 216 may include a substrate shaped as a semiconductor wafer. It is noted herein that the dimensions of the cleaning substrate 216 may vary in order to optimize the cleaning of the chuck 212, such that the cleaning substrate 216 may be handled as if it were a standard silicon wafer (e.g., the wafer 210).

Figure 4:
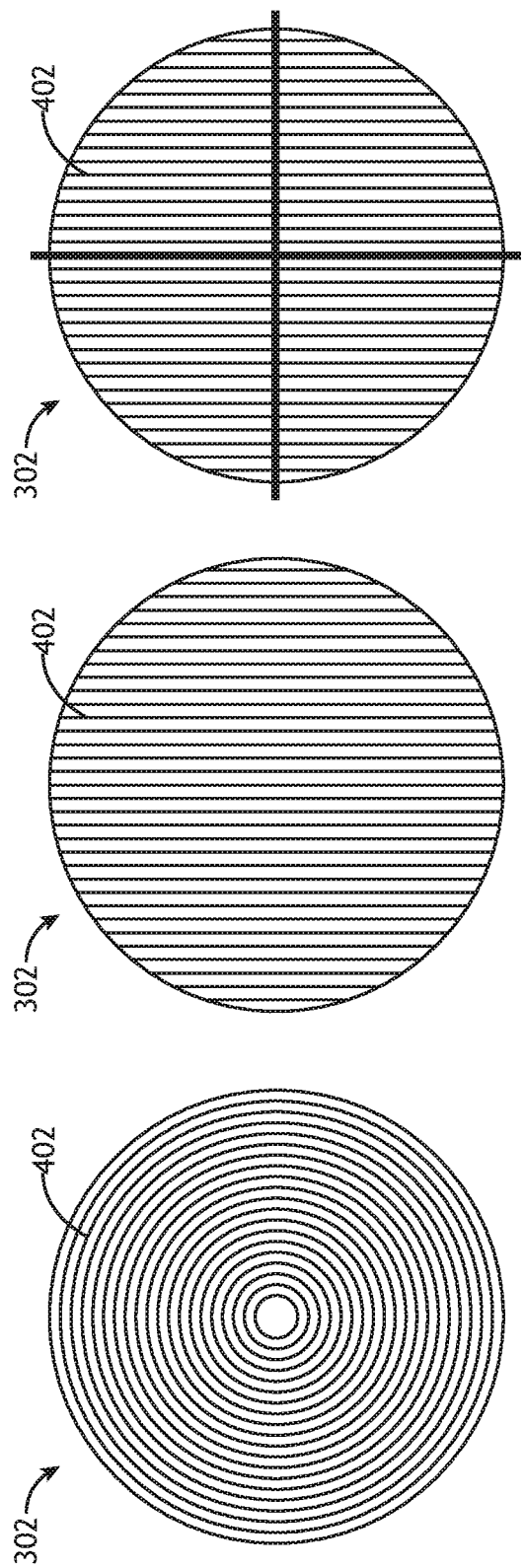
FIG. 4 illustrates a simplified top down view of one or more patterns formed on a surface of the cleaning substrate, in accordance with one or more embodiments of the present disclosure.

FIG. 4 illustrates a simplified top down view of one or more patterns 302 formed on a surface (e.g., top side or bottom side) of the cleaning substrate 216, in accordance with one or more embodiments of the present disclosure.

In another embodiment, one or more patterns 302 are formed on a surface (e.g., top side or bottom side) of the cleaning substrate 216. For example, the one or more patterns 302 may be formed on a bottom side of the cleaning substrate 216. By way of another example, the one or more patterns 302 may be formed on a top side of the cleaning substrate 216. It is noted herein that the one or more patterns 302 may be formed using any material known in the art suitable for withstanding the process chamber 102 conditions (e.g., temperature and other environmental conditions) during the cleaning process described herein. For example, carbon nanotubes (CNTs) may be deposited on a surface (e.g., top side or bottom side) of the cleaning substrate 216 to form the one or more patterns 302, such that the Van der Waal forces are amplified (e.g., to optimize the cleaning of the chuck 212), as described by:

$$F = \frac{H_{12}R}{6d^2} \quad \text{Eqn. 5}$$

$$F = \frac{H_{12}R^2}{6d^2} \quad \text{Eqn. 6}$$

In Eqns. 5-6, $H_{12}$ is the Hamaker's constant, R is the size of the particle 214, and d is the distance between the particle 214 and the CNTs deposited on the surface of the cleaning substrate 216. As shown by Eqn. 6, when CNTs are deposited on the surface of the cleaning substrate 216 the Van der Waals forces are enhanced due to $R^2$ dependence relative to R dependency in Eqn. 5.

It is noted herein that the stiffness and thermal stability of the CNT patterned layers (e.g., one or more patterns 302 formed of CNTs) of the cleaning substrate 216 creates a brush effect that will grasp the particles without causing further contamination (e.g., breaking the particles). Further, the use of CNTs enables adding electrical features that will help to attract particles (as shown in FIG. 3B).

In another embodiment, the cleaning substrate 216 includes a plurality of pattern types 302. For example, the plurality of pattern types 302 may include, but is not limited to, one or more pitches, such that each pattern type is configured for attracting the one or more particles 214 of different dimensions. For instance, a single cleaning substrate (e.g., the cleaning substrate 216) may have a first pattern 302 and a second pattern 302, such that the shape of the patterns 302 may optimally clean the chuck 212.

In another embodiment, one or more structures 402 within the one or more patterns 302 attract the one or more particles 214 from the chuck 212 via at least one of electrostatic attraction, mechanical trapping, or the like when the cleaning substrate 216 is positioned on the chuck 212.

Figure 3A:
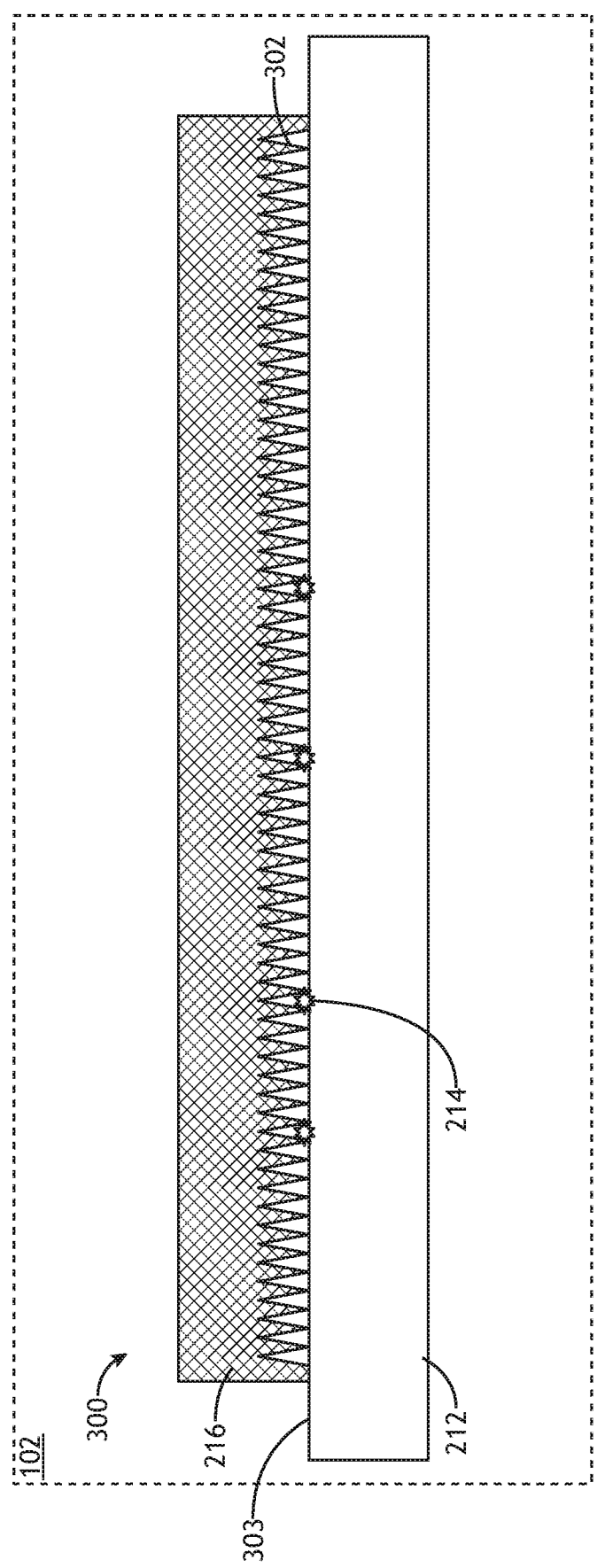
FIG. 3A illustrates a simplified schematic view of the cleaning assembly including a cleaning substrate, in accordance with one or more embodiments of the present disclosure.
Figure 3B:
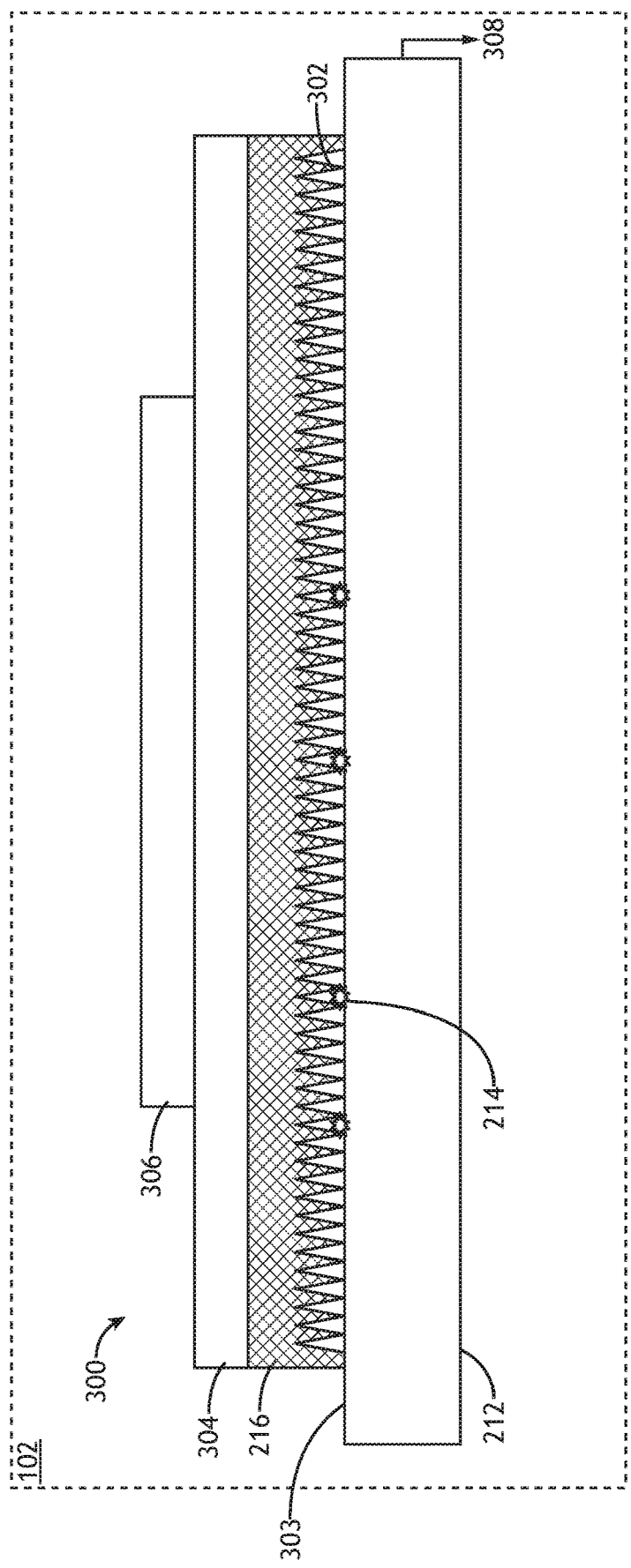
FIG. 3B illustrates a simplified schematic view of the cleaning assembly including the cleaning substrate and a power source, in accordance with one or more embodiments of the present disclosure.

Referring to FIG. 3A, in another embodiment, the one or more particles 214 are removed from the chuck 212 via electrostatic attraction. In this regard, the one or more particles 214 on the surface 303 of chuck 212 are charged by conduction and a high electric field is created by the closeness of the cleaning substrate 216. Further, the one or more particles 214 experience a force (described below) that may exceed an adhesive force, such that the one or more particles 214 move to the cleaning substrate 216 (e.g., the cleaning substrate 216 attracts the one or more particles 214). It is noted herein that the one or more particles 214 charge more slowly on the cleaning substrate 216 such that the particles do not return to the chuck 212.

For example, the electrostatic attraction of the particles 214 may be caused by Van der Waals forces. For instance, when the cleaning substrate 216 is placed near a surface (e.g., top side or bottom side) of the chuck 212 the Van der Waals (VDW) forces remove the particles 214 from the surface (e.g., top side or bottom side) of the chuck 212 (e.g., the VDW forces exceed the adhesive forces of the one or more particles 214). The sum of Van der Waals forces (F(s)) of the cleaning substrate 216 may be described by:

$$F(s) = \frac{-A \cdot R}{6s^2} \quad \text{Eqn. 7}$$

In Eqn. 7, A is the Hamaker constant, S is the separation between the particle and the surface of the cleaning substrate (dipole induced effect is ignored), R is the radius of the particle, and the minus sign (−) describes the fact that the force is attractive. For example, A may be $1.40 \times 10^{-19}$ Joules (J), R may be $5.00 \times 10^{-6}$ m, and S may be $4.00 \times 10^{-19}$ m, such that the Van der Waals forces (F(s)) may be approximately $-7.29 \times 10^{-7}$ N. In this regard, the gravity force (e.g., $-10^{-11}$ N) is negligible. The Lifshitz-Van der Waals formula (F(s)), which accounts for the surface roughness of the one or more particles, may be described by:

$$F(s) = \frac{-h \cdot r}{8\pi s^2} \frac{h \cdot r_a^2}{8\pi s^3} \quad \text{Eqn. 8}$$

In Eqn. 8, $r_a$ is the surface curvature radius, h is the Lifshitz-Van der Waals constant (in energy units), and S is the separation between the particle and the surface of the cleaning substrate.

In another embodiment, the one or more particles 214 are removed by the cleaning substrate 216 via magnetic forces. For example, a magnetic force arises from the interaction of magnetic dipoles in the one or more particles 214 and in the cleaning substrate 216. The general form of magnetic forces ($F_m$) may be described by:

$$F_m = (m \cdot \nabla)H \quad \text{Eqn. 9}$$

$$H(r) = \frac{3\hat{r}(r \cdot m_1)(m_2 \cdot r) - m_1 \cdot m_2}{r^3} \quad \text{Eqn. 10}$$

$$\text{then, } F = \nabla \left[ \frac{3(m_1 \cdot r)(m_2 \cdot r) - m_1 \cdot m_2}{r^3} \right] \quad \text{Eqn. 11}$$

In Eqn. 9-11, m is the magnetic dipole, $\nabla$ is the gradient, and H is the magnetic field. In Eqn. 10-11, $m_1$ and $m_2$ are the magnetic dipoles of the particles and the cleaning substrate, respectively. Further, in Eqn. 10, $\hat{r}$ is the unit vector that points in the direction of r. Assuming that dipoles $m_1$ and $m_2$ are orientated along the Z-axis, the force of their interaction ($F_z$) may be described by:

$$F_Z = \frac{6m_1 m_2}{Z^4} \quad \text{Eqn. 12}$$

In Eqn. 12, the resultant force ($F_z$) may be approximately $5.00 \times 10^{-11}$ N for iron particles having a diameter (Z) of 1000 Å magnetized to saturation (m~$10^{-15}$ emu) and separated by a distance (Z) 1000 Å. In this regard, the rate of change of the force ($\partial F/\partial Z$) may be approximately $2.00 \times 10^{-2}$ N/m.

Figure 3C:
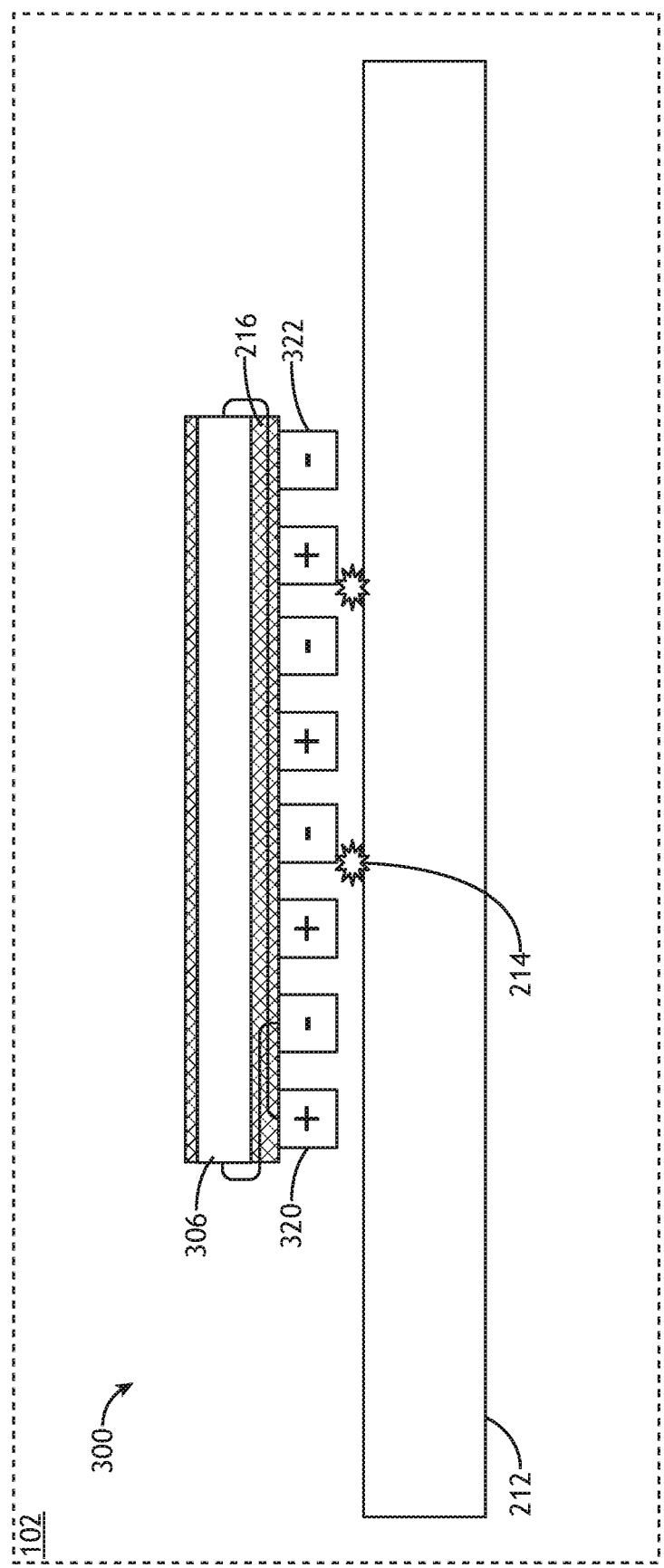
FIG. 3C illustrates a simplified schematic view of the cleaning assembly including the cleaning substrate and a power source, in accordance with one or more embodiments of the present disclosure.

Referring to FIGS. 3B and 3C, in another embodiment, the cleaning assembly 300 includes a power source 306. The power source 306 may include any power source known in the art. For example, the power source 306 may include a direct current (DC) power source. For instance, the DC power source may include one or more batteries (e.g., a nickel metal hydride battery, a lithium-ion battery, a lithium-ion polymer battery, a sodium ion battery, or the like). By way of another example, the power source 306 may include an alternating current (AC) power source.

Referring to FIG. 3B, in another embodiment, the cleaning assembly 300 includes a conductor element 304 attached to a top side of the substrate 216. The conductor element 304 may include any conductor element known in the art. For example, the conductor element 304 may include an electrode. For instance, the conductor element 304 may include a metal layer or coating containing at least one of aluminum (Al), gold (Au), cooper (Cu), or the like. In another embodiment, the power source 306 is electrically coupled to the conductor element 304. In another embodiment, the chuck 212 is conductive and connected to ground 308. In this regard the cleaning assembly 300 is in a capacitor configuration such that the conductor element 304 and the chuck 212 are acting as electrodes and separated by a dielectric (e.g., the cleaning substrate 216). The power source 306 may be positioned onboard the cleaning substrate 216. For instance, the one or more batteries may be positioned on the top side of the conductor element 304 and electrically coupled to the conductor element 304.

It is noted herein that the chuck 212 of the cleaning assembly 300 is not limited to a conductive chuck. For example, the cleaning assembly 300 may include a non-conductive chuck. Therefore, the above description should not be interpreted as a limitation on the scope of the present disclosure but merely an illustration.

Referring to FIG. 3C, in another embodiment, the cleaning assembly 300 includes one or more anode/cathode 320, 322 pairs arranged in a horizontal configuration. For example, for each pair an electric field may be established between the cathode and anode. The electric field assists with the uptake of particles from the chuck 212 surface.

In another embodiment, the power source 306 is configured to establish an electric field between the conductor element 304 and the chuck 212. In another embodiment, the power source 306 is configured to establish an electric field between the anode/cathode and the chuck 212. For example, the power source 306 may be configured to establish an electric field between 0.1 kV and 5 kV. For instance, the power source 306 may be configured to establish an electric field of 2.5 kV. It is noted herein that the electric field enhances the electrostatic-based uptake of charged particles (e.g., the one or more particles 214) from the chuck 212. The electrostatic force ($F_e$) of the cleaning substrate may be described by:

$$F_e = \frac{\varepsilon_0 \cdot \varepsilon_r \cdot A_e \cdot V^2}{2 \cdot h^2} \quad \text{Eqn. 13}$$

In Eqn. 13, $\varepsilon_0$ is the dielectric constant (e.g., for vacuum $\varepsilon_0=1$), $\varepsilon_r$ is the dielectric permittivity (e.g., for vacuum $\varepsilon_r=8.85\times10^{-12}$ F/m), $A_e$ is the effective area of the particle (m$^2$), V is the voltage difference between the particle and electrode (Volts), and h is the gap between the particle and electrode (meters). For example, V may be $5.00\times10^2$ Volts such that the electrostatic force ($F_e$) is $3.48\times10^{-6}$ N. In this regard, the force of gravity (e.g., $-10^{-11}$ N) is negligible, such that the cleaning substrate 216 may remove the one or more particles 214 from the chuck 212.

Figure 3D:
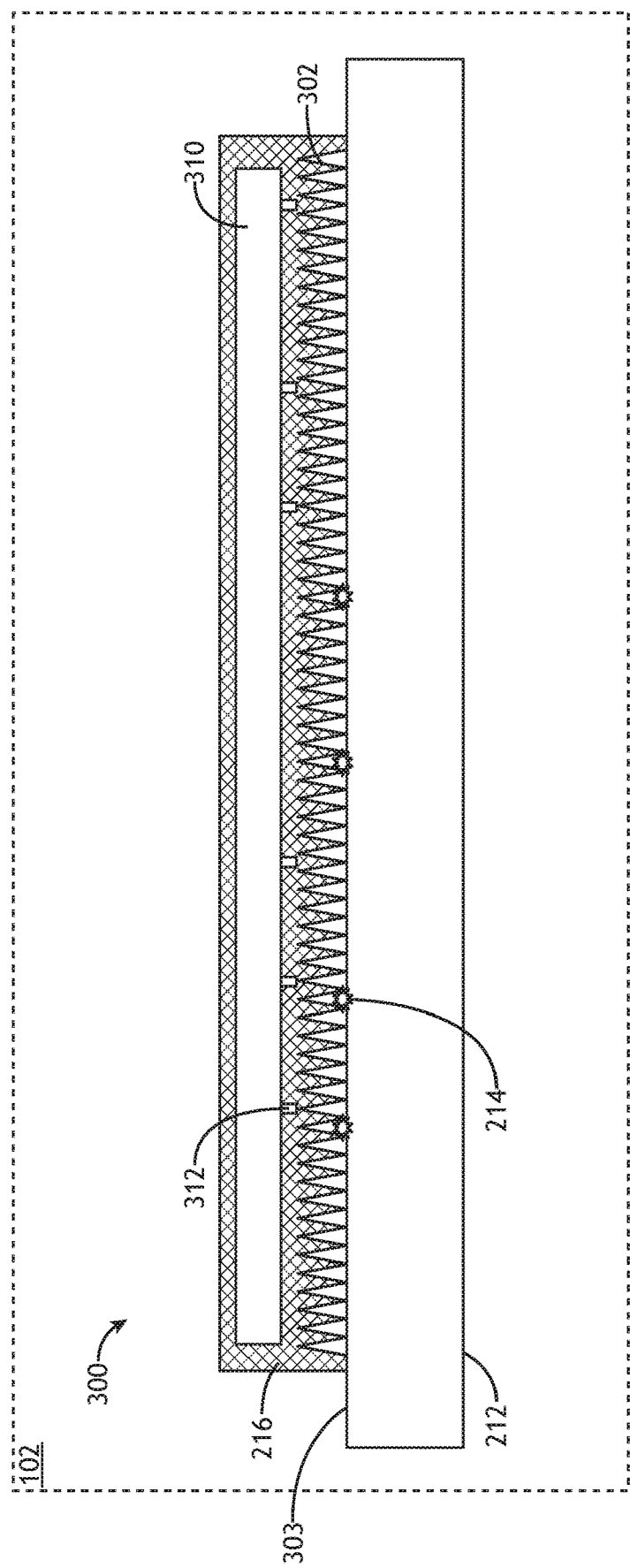
FIG. 3D illustrates a simplified schematic view of the cleaning assembly including the cleaning substrate and a reservoir, in accordance with one or more embodiments of the present disclosure.
Figure 3E:
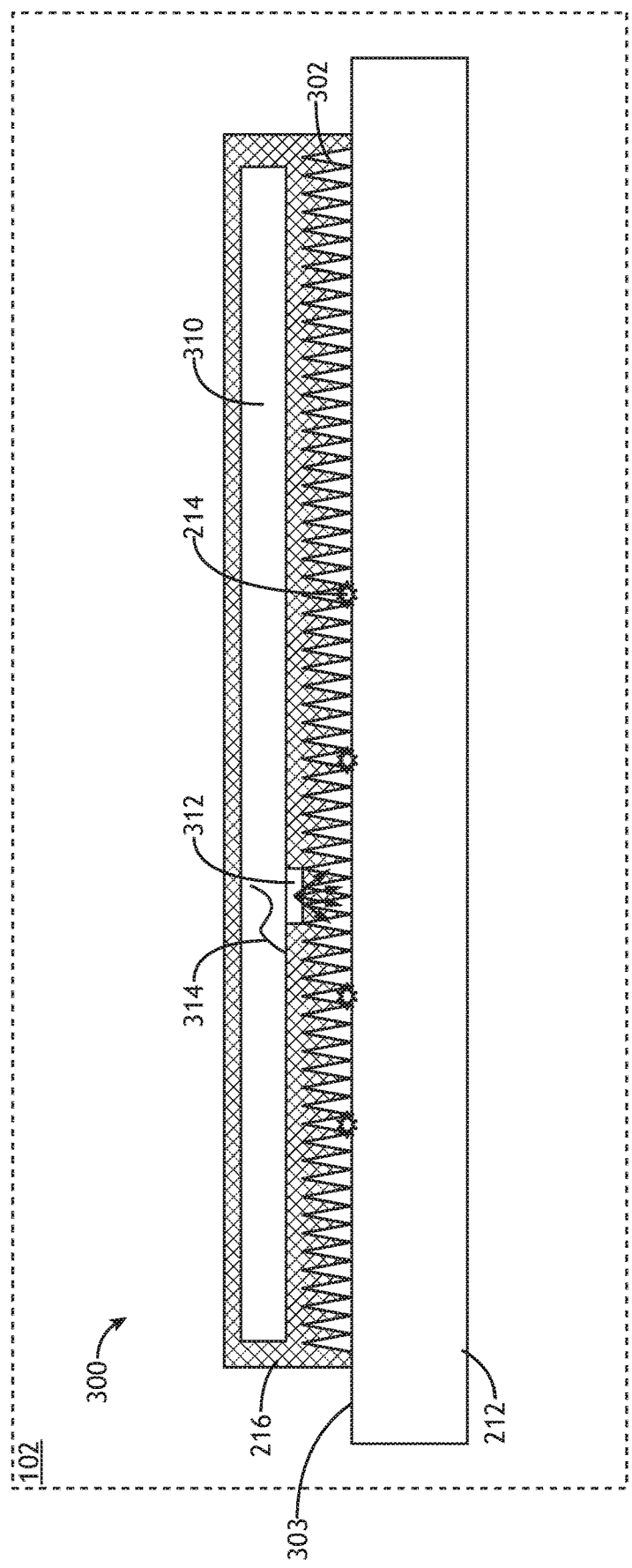
FIG. 3E illustrates a simplified schematic view of the cleaning assembly including the cleaning substrate and a reservoir, in accordance with one or more embodiments of the present disclosure.
Figure 3F:
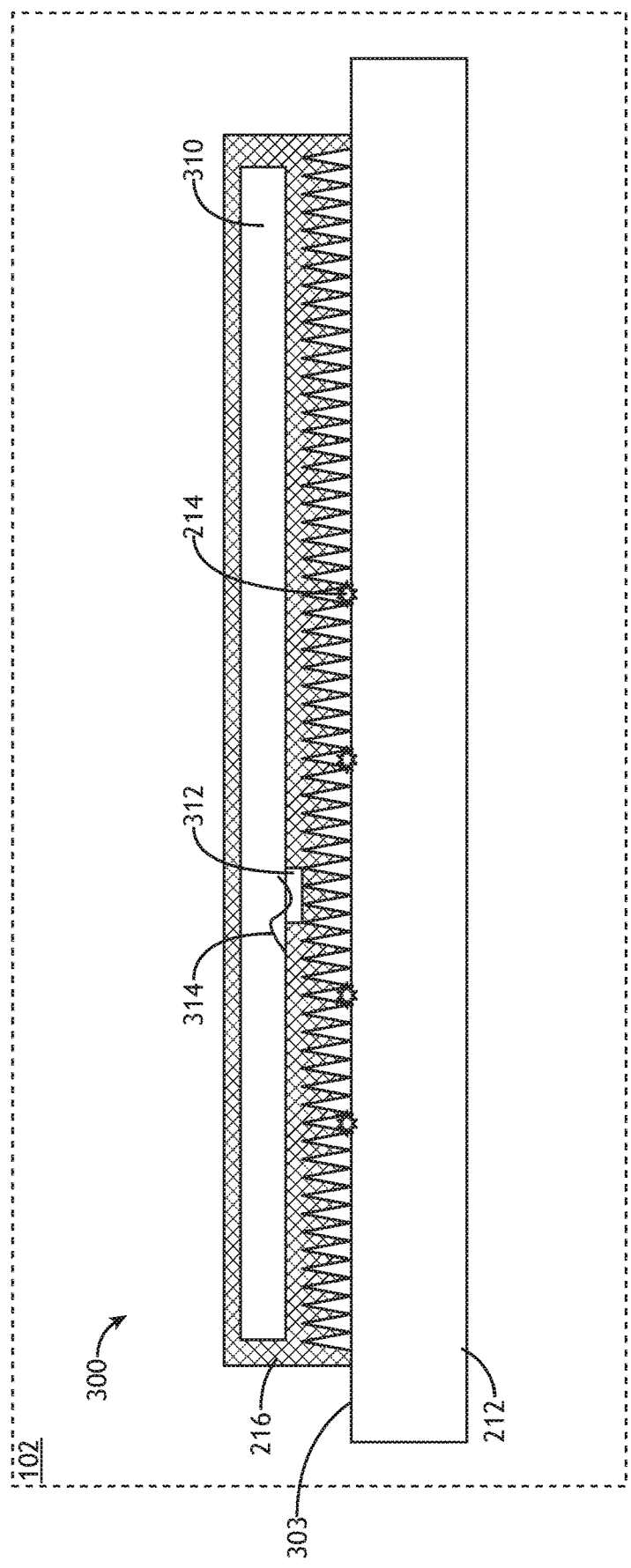
FIG. 3F illustrates a simplified schematic view of the cleaning assembly including the cleaning substrate and a reservoir, in accordance with one or more embodiments of the present disclosure.

Referring to FIGS. 3E through 3F, in another embodiment, the cleaning assembly 300 includes one or more reservoirs 310 arranged within the cleaning substrate 216. It is noted herein that the size, location, and shape of the one or more reservoirs 310 depicted in FIGS. 3C through 3E is merely illustrative and shall not limit the scope of the present disclosure.

In another embodiment, the cleaning assembly 300 includes one or more valves 312 configured to release one or more reactants. It is noted herein that the one or more reactants may include any reactant known in the art suitable for cleaning the chuck. For example, the one or more reactants may include one or more reactant radicals. For instance, the one or more reactant radicals may include at least one of atmospheric oxygen, fluorine, nitrogen, or the like.

Referring to FIG. 3E, in another embodiment, the one or more valves 312 include one or more mechanical valves configured to open when the cleaning substrate 216 is positioned on the chuck 212. For example, although not shown, the cleaning assembly 300 may include a controller configured to cause one or more processors to release the one or more reactants from the one or more valves 312 (e.g., the one or more mechanical valves).

Referring to FIGS. 3E and 3F, in another embodiment, the one or more reservoirs 310 are configured to release the one or more reactants upon exposure to thermal impact.

In another embodiment, the one or more reservoirs 310 include a shape memory alloy actuator 314 configured to activate the one or more valves 312 upon exposure to thermal impact. For example, the shape memory alloy actuator 314 may be configured to open the one or more valves 312 based on a temperature change of the shape memory alloy actuator 314. For instance, the shape memory allow actuator 314 is configured to undergo shape deformation upon a threshold transformation temperature and recovers to its original shape upon heating to a temperature above the threshold transformation temperature. It is noted herein that the threshold transformation temperature may be between room temperature (e.g., 23° C.) and 520° C.

It is noted herein that the shape memory alloy actuator 314 may be formed from any alloy known in the art, including but not limited to, a nickel-titanium alloy (nitinol), copper-iron alloy, or the like. For example, the shape memory alloy actuator 314 may include a nitinol actuator, such that the nitinol actuator decreases the risk of a chemical reactor leak when such leak is not desired.

Figure 3G:
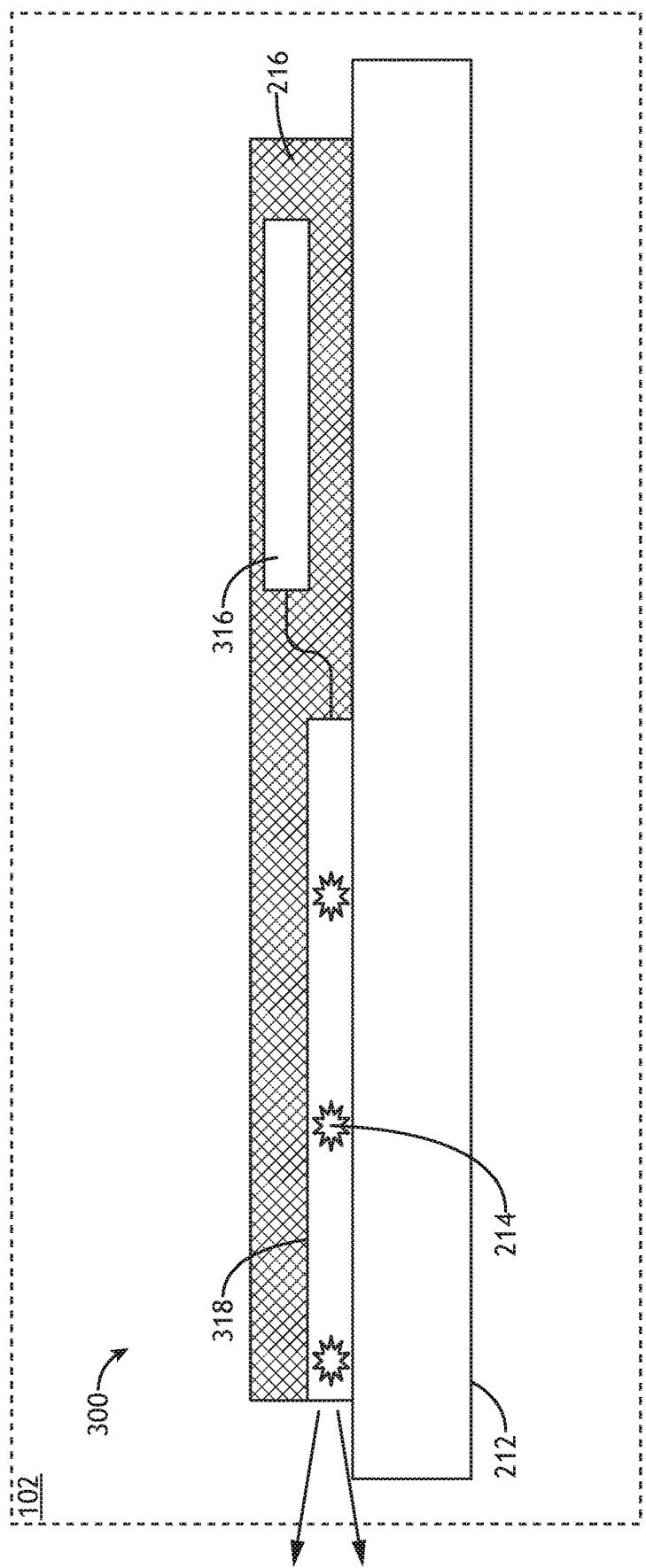
FIG. 3G illustrates a simplified schematic view of the cleaning assembly including the cleaning substrate and a gas reservoir, in accordance with one or more embodiments of the present disclosure.

Referring to FIG. 3G, in another embodiment, the cleaning assembly 300 includes a gas reservoir 316 configured to contain one or more gases. The gas reservoir 316 may include any gas known in the art, including but not limited to, argon gas, or the like In another embodiment, the cleaning assembly 300 includes one or more tunnels 318 arranged within the cleaning substrate 216. It is noted herein that the size, location, and shape of the one or more tunnels 318 depicted in FIG. 3G is merely illustrative and shall not limit the scope of the present disclosure.

In another embodiment, the gas reservoir releases the one or more gases and the one or more gases move the one or more particles 214 via temporal flow. For example, the particles may be ejected from the chuck 212 via the gas and pumped out by a pump in the process chamber 102.

Reynolds number ($R_e$) (Eqn. 14) may be used to predict flow patterns of the one or more gases. For example, a low (e.g., $10-10^3$) Reynolds number ($R_e$) indicates a laminar flow in the tunnel. By way of another example, a high (e.g., greater than $10^3$) Reynolds number ($R_e$) indicates a turbulent flow in the tunnel. Reynolds number ($R_e$) may be described by:

$$R_e = \frac{UL\rho}{\mu} \quad \text{Eqn. 14}$$

$$P_1 + 0.5\rho v_1^2 = P_2 + 0.5\rho v_2^2 \quad \text{Eqn. 15}$$

In Eqn. 14, L is linear dimension (m); U is the velocity of fluid with respect to the particle (m/s); $\rho$ is the density of the fluid (kg/m$^3$); and $\mu$ is the dynamic viscosity of the fluid (Pa s). For example, when argon gas is used, L=50 m, $\mu=4.64\times10^{-5}$ Pa s (at 500° C. or 773 K), $\mu=1.6172$ kg/m$^3$ (at 2.6 atm) and U ($v_2$)=570 m/s (solved using Eqn. 15), such that $R_e=0.993\times10^6$. In this regard, the high Reynolds number indicates that the flow of gas in the tunnel is turbulent. The drag force (FD) (e.g., the force component in the direction of the flow velocity) may be described by:

$$F_D = \tfrac{1}{2}\rho u^2 C_D A \quad \text{Eqn. 16}$$

In Eqn. 16, $\rho$ is the mass density of the fluid; u is the flow velocity relative to the object; A is the reference area; and $C_D$ is the drag coefficient. It is noted herein that the drag coefficient ($C_D$) depends on the Reynolds number $R_e$ (as shown in Eqn. 14). For example, $\rho=1.6172$ kg/m$^3$ (at 2.6 atm), u=570 m/s, $C_D$=0.1 (smooth sphere when $R_e$=10$^6$), A=7.853×10$^{-11}$ m$^2$, such that $F_D$=2.06×10$^{-6}$ N. The relationship between drag force ($F_D$) and particle removal (e.g., accumulator pressure, $P_D$) may be described by:

$$P_D = \frac{1}{2}\rho u^2 \qquad \text{Eqn. 17}$$

$$\text{where } u^2 = \frac{2P_D}{\rho} \qquad \text{Eqn. 18}$$

$$F_D = \frac{1}{2}\rho \frac{2P_D}{\rho} C_D A = P_D C_D A \qquad \text{Eqn. 19}$$

For example, particle removal is directly proportional to the accumulator pressure ($P_D$) and particle size (A). For instance, it may be necessary to increase the initial pressure in order to accurately remove the particles. It is noted herein that although calculations above (Eqn. 14-19) assume the pressure is 2.6 atm, such pressure is provided merely for illustrative purposes and shall not limit the scope of the present disclosure.

It is noted herein that the one or more particles 214 may be any size known in the art. For example, the one or more particles may between 0-1.0 μm. For instance, the one or more particles may be 0.019 μm. Further, it is noted herein that the one or more particles 214 may be any type of particle known in the art, including but not limited to, airborne molecule contamination (AMC), metal, or the like. For example, the one or more particles 214 may be metal (Al, Cu, or the like), fluorinated rubber (e.g., o-ring), grease, metal oxide, oxide film, bare silicon (Si), thermal oxide, nitride film, PR, Si, fluorine deposition, quartz, or the like.

Further, it is noted herein that the process chamber 102 may have various chemical residues on the walls of the process chamber 102. For example, during CVD, the chamber walls may have a halide residue (e.g., HCl, HI, F, or the like). By way of another example, during etching, the chamber wall may have residue containing at least one of: C, O, F, Al, Y, Fe, Na, Ti, Zr, or the like.

Figure 5:
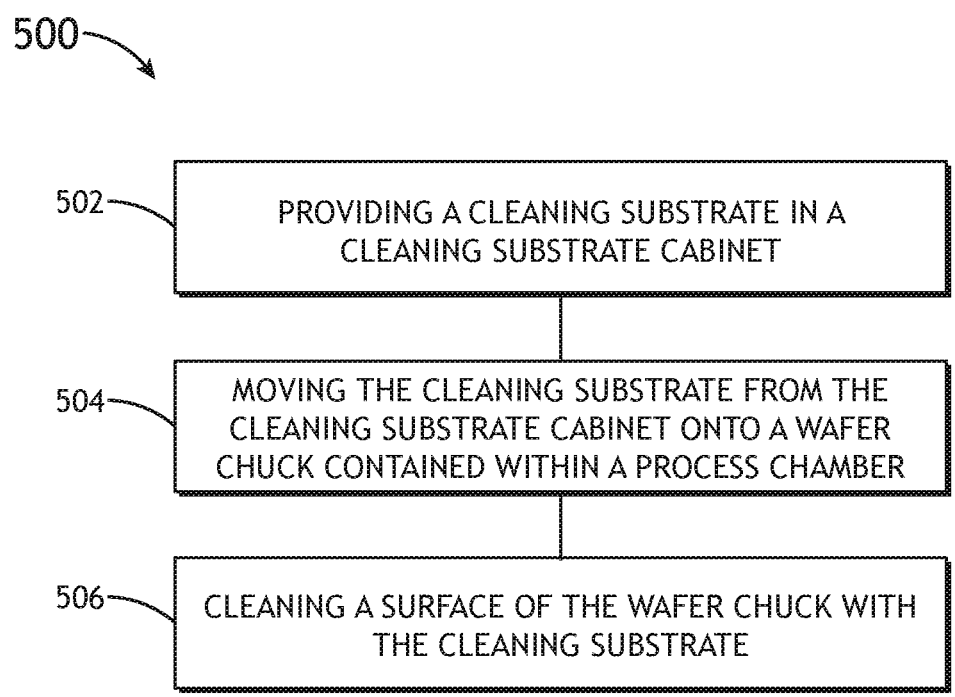
FIG. 5 illustrates a flow diagram depicting a method for cleaning a wafer chuck of a process tool with the cleaning assembly, in accordance with one or more embodiments of the present disclosure.

FIG. 5 illustrates a flow diagram depicting a method 500 for cleaning the chuck 212 of the process tool 100 with the cleaning assembly 300, in accordance with one or more embodiments of the present disclosure. It is noted herein that the steps of method 500 may be implemented all or in part by system 100. It is further recognized, however, that the method 500 is not limited to the system 100 in that additional or alternative system-level embodiments may carry out all or part of the steps of method 500.

In step 502, a cleaning substrate is provided in a cleaning substrate cabinet. In another embodiment, the cleaning substrate cabinet 120 is configured to store (e.g., mount) the one or more cleaning substrates 216 in the cabinet 120 and prepare the one or more cleaning substrates 216 for an optimal cleaning process.

In step 504, the cleaning substrate is moved from the cleaning substrate cabinet 120 onto a wafer chuck 212 contained within a process chamber 102. In another embodiment, the one or more robotic assemblies 110 are configured to remove the cleaning substrate 216 from the cleaning substrate cabinet 120 to begin the cleaning process. For example, the edge gripper 209 of the robotic assembly 110 may interact with the cleaning substrate 216 in order to remove the cleaning substrate 216 from the cleaning substrate cabinet 120.

In another embodiment, the one or more robotic assemblies are configured to position the cleaning substrate 216 near the chuck 212 of the one or more process tools 100. For example, after the cleaning substrate 216 is removed from the cleaning substrate cabinet 120 via the robotic assembly 110, the robotic assembly 110 may transport (e.g., deliver) the cleaning substrate to the robotic assembly 116 of the handling device 112. By way of another example, the robotic assembly 116 may insert the cleaning substrate 216 into the process chamber 102 of the process tool 100.

In step 506, a surface 303 of the wafer chuck is cleaned with the cleaning substrate. The chuck 212 may be cleaned using at least one of electrostatic attraction, mechanical trapping, or the like (as shown in FIGS. 3A through 3E).

Figure 6:
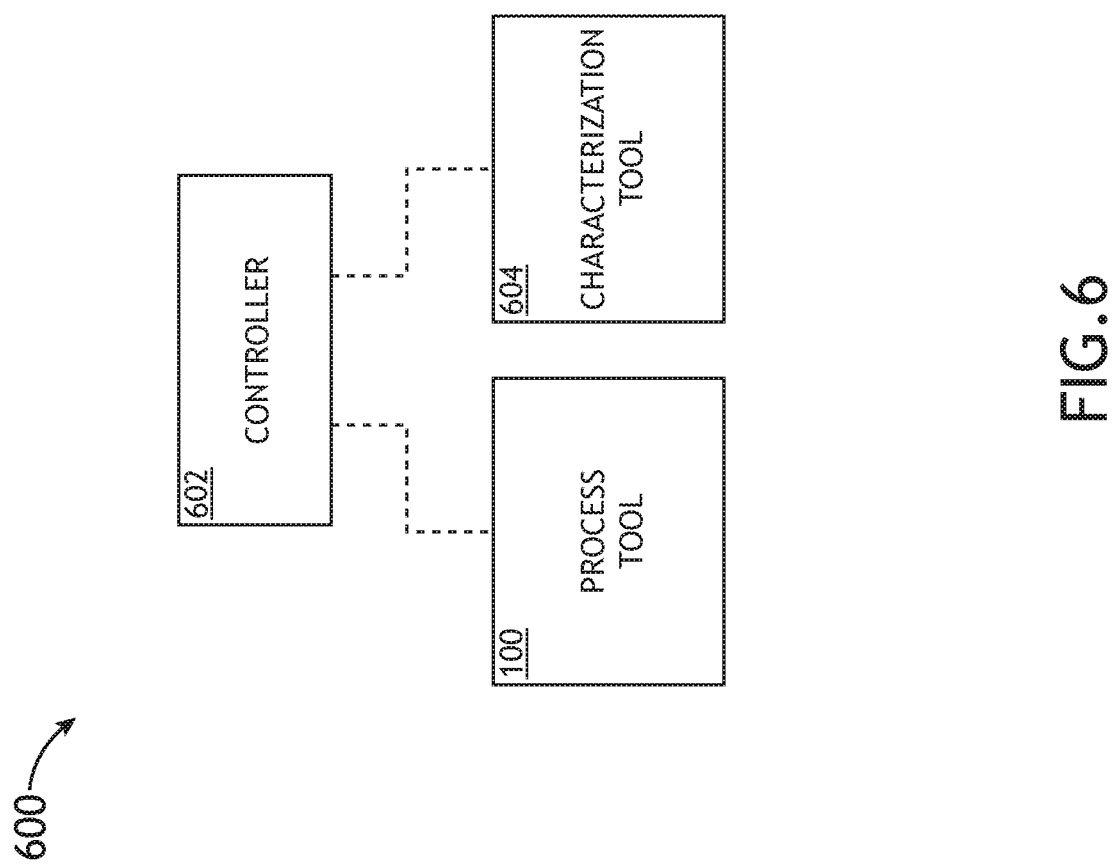
FIG. 6 illustrates a simplified schematic view of a characterization system configured to direct the implementation of cleaning the wafer chuck of the process tool, in accordance with one or more embodiments of the present disclosure.

FIG. 6 illustrates simplified schematic view of a characterization system 600 configured to direct the implementation of cleaning the wafer chuck 212 of the process tool 100, in accordance with one or more embodiments of the present disclosure.

Referring generally to FIG. 6, in one embodiment, the system 600 includes one or more process tools 100 (e.g., the processing system 100 shown in FIG. 1), a controller 602, and one or more characterization tools 604.

In another embodiment, the one or more characterization tools 604 (e.g., characterization sub-system) include one or more inspection tools. For example, the one or more inspection tools may include, but are not limited to, an optical characterization tool. For instance, the optical characterization tool may include an optical characterization tool capable of generating one or more high-resolution images representing the electrical intent of the wafer 210 and capable of operating at a wavelength corresponding to, but not limited to, visible light, ultraviolet (UV) radiation, deep ultraviolet (DUV) radiation, vacuum ultraviolet (VUV) radiation, extreme ultraviolet (EUV) radiation, and/or X-ray radiation. In addition, the optical characterization tool may include a broadband inspection tool including, but not limited to, a laser sustained plasma (LSP) based inspection tool. Further, the optical characterization tool may include a narrowband characterization tool, such as, but not limited to, a laser scanning inspection tool. A description of an inspection tool is described in U.S. Pat. No. 8,559,001, issued Oct. 15, 2013, which is incorporated herein by reference in the entirety. Additionally, a description of an inspection tool is described in U.S. Pat. No. 9,170,209, issued Oct. 27, 2015, which is incorporated herein in the entirety. Further, a description of an inspection tool is described in U.S. Pat. No. 8,749,149, issued Jun. 10, 2014, which is incorporated herein in the entirety. Additionally, a description of an inspection tool is described in U.S. Pat. No. 8,941,336, issued Jan. 27, 2015, which is incorporated herein by reference in the entirety.

In another embodiment, the one or more characterization tools 604 include one or more review tools. For example, the one or more characterization tools 604 include one or more particle-beam review tools. For instance, the one or more particle-beam review tools may include, but is not limited to, an electron-beam (e-beam) tool. A description of a particle-beam review tool is described in U.S. patent application Ser. No. 16/163,263, filed Oct. 17, 2018, which is incorporated herein by reference in the entirety. Additionally, a description of a particle-beam review tool is described in U.S. patent application Ser. No. 16/564,981, filed Sep. 9, 2019, which is incorporated herein by reference in the entirety.

In another embodiment, the system 600 includes a controller 602 including one or more processors. In another embodiment, the controller 602 is operably coupled to one or more components of the system 600. For example, the controller 602 may be operably coupled to the one or more process tools 100, the one or more characterization tools 604, and/or one or more additional components. In this regard, the controller 602 may direct any of the components of the system 600 and/or any components of the one or more process tools 100, the one or more characterization tools 604, and/or the one or more additional components to carry out any one or more of the various functions described throughout the present disclosure.

In another embodiment, system 600 may include the controller 602 communicatively coupled to the server via network. In another embodiment, controller 602 includes the one or more processors and memory. In another embodiment, the one or more processors may be configured to execute a set of program instructions stored in memory, wherein the set of program instructions are configured to cause the one or more processors to carry out the steps of the present disclosure. It is noted herein that the discussion herein regarding server, one or more processors, and memory may also be regarded as applying to controller 602, one or more processors, and memory, unless noted otherwise herein.

It is noted herein that the one or more components of system 600 may be communicatively coupled to the various other components of system 600 in any manner known in the art. For example, the one or more processors may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

In one embodiment, the one or more processors may include any one or more processing elements known in the art. In this sense, the one or more processors may include any microprocessor-type device configured to execute software algorithms and/or instructions. In one embodiment, the one or more processors may consist of a desktop computer, mainframe computer system, workstation, image computer, parallel processor, or other computer system (e.g., networked computer) configured to execute a program configured to operate the system 600, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors. In general, the term "processor" may be broadly defined to encompass any device having one or more processing elements, which execute program instructions from memory. Moreover, different subsystems of the system 600 may include processor or logic elements suitable for carrying out at least a portion of the steps described throughout the present disclosure. Therefore, the above description should not be interpreted as a limitation on the present disclosure but merely an illustration.

The memory may include any storage medium known in the art suitable for storing program instructions executable by the associated one or more processors and the data received from the transmitting devices. For example, the memory may include a non-transitory memory medium. For instance, the memory may include, but is not limited to, a read-only memory (ROM), a random access memory (RAM), a magnetic or optical memory device (e.g., disk), a magnetic tape, a solid state drive and the like. In another embodiment, the memory is configured to store data including, but not limited to, entity data, association data (e.g., spatial relationship data), operations data, GPS data, time-stamped data, geo-fenced data, and the like received from transmitting devices. It is further noted that memory may be housed in a common controller housing with the one or more processors. In an alternative embodiment, the memory may be located remotely with respect to the physical location of the processors, server, controller, and the like. In another embodiment, the memory maintains program instructions for causing the one or more processors to carry out the various steps described through the present disclosure.

Figure 7:
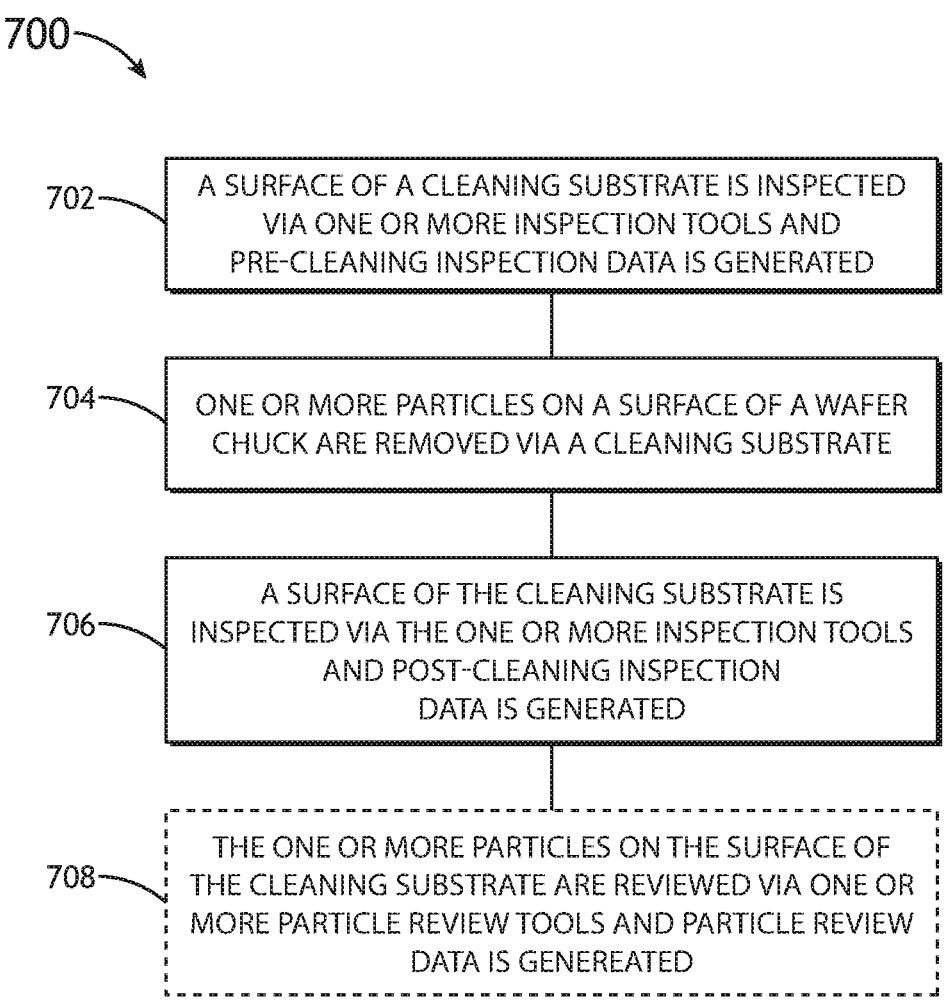
FIG. 7 illustrates a flow diagram depicting a method of determining cleaning efficiency of the cleaning substrate, in accordance with one or more embodiments of the present disclosure.
Figure 8:
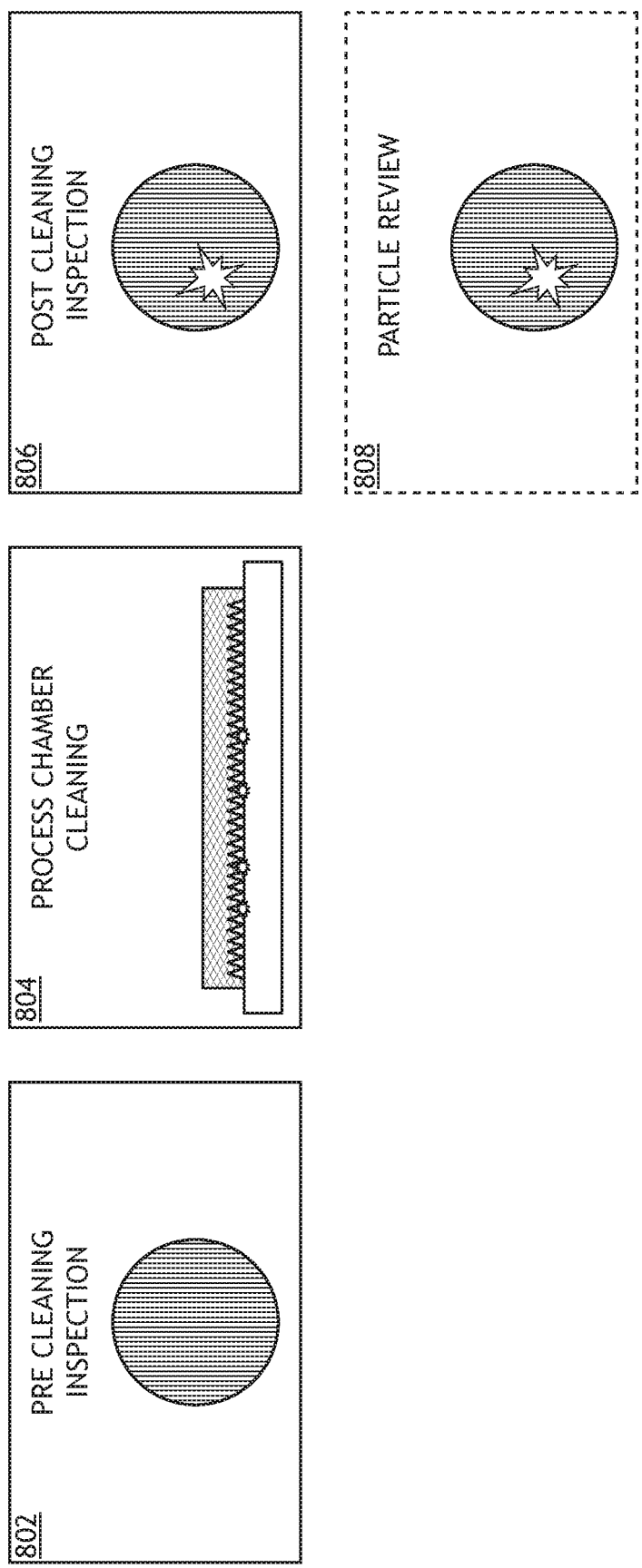
FIG. 8 illustrates an example implementation of inspection- and review-driven cleaning efficiency determination, in accordance with one or more embodiments of the present disclosure.

FIG. 7 illustrates a flow diagram depicting a method 700 of using the characterization system to gather characterization data to be used to determine cleaning efficiency of the cleaning substrate 216, in accordance with one or more embodiments of the present disclosure. FIG. 8 illustrates an example illustration of one or more steps of the method 700 shown in FIG. 7, in accordance with one or more embodiments of the present disclosure. It is noted herein that the steps of method 700 may be implemented all or in part by system 600. It is further recognized, however, that the method 700 is not limited to the system 600 in that additional or alternative system-level embodiments may carry out all or part of the steps of method 700.

In step 702, a surface of a cleaning substrate 216 is inspected via one or more inspection tools and pre-cleaning inspection data is generated, as illustrated in view 802 of FIG. 8. For example, the inspection tool may be configured to inspect a surface of the cleaning substrate 216 to generate pre-cleaning inspection data about the surface of the cleaning substrate 216. For instance, the pre-cleaning inspection data may include information about the one or more patterns 302 of the cleaning substrate 216.

In step 704, one or more particles 214 on a surface 303 of a wafer chuck 212 are removed via a cleaning substrate 216, as illustrated in view 804 of FIG. 8. For example, the cleaning substrate 216, when positioned near a surface 303 of the chuck 212, may remove the one or more particles 214 from the surface 303 of the chuck 212.

In step 706, a surface of the cleaning substrate 216 is inspected via the one or more inspection tools and post-cleaning inspection data is generated, as illustrated in view 806 of FIG. 8. In another embodiment, the one or more inspection tools are configured to generate post-cleaning inspection data based on the inspection of the surface of the cleaning substrate 216. For example, the one or more inspection tools are configured to detect the one or more particles 214 on the cleaning substrate, which were removed from the chuck 212 during the process chamber cleaning step 614. The inspection data may include information about the location, size, and materials of the one or more particles 214 on the cleaning substrate 216.

In another embodiment, the inspection tool is configured to compare the inspection data from step 702 and step 706, respectively. For example, the inspection tool may compare the total signal summation reflected from the cleaning substrate 216, such that any difference will indicate cleaning action. By way of another example, the cleaning substrate 216 may have a known pattern (e.g., rows or circles at a specific pitch). For instance, the inspection tool may compare areas across the cleaning substrate 216 and detect any deviation from the known pattern (e.g., rows or circles at a specific pitch) identified during step 702.

In an optional step 708, the one or more particles 214 on the surface of the cleaning substrate 216 are reviewed via one or more particle review tools and particle review data is generated, as illustrated in view 808 of FIG. 8. For example, the one or more particle review tools may image a surface of the cleaning substrate 216 in order to capture images of one or more defects on the surface of the cleaning substrate 216. For instance, the one or more particle review tools may capture images of the one or more particles on the surface of the cleaning substrate 216. The particle review data may include more detailed information than the post-cleaning inspection data about the location, size, and/or material of the one or more particles 214. In this regard, the particle review data may be used to prepare a cleaning substrate 216 for optimal cleaning. For example, the particle review data may be used to determine one or more patterns 302 of the cleaning substrate 216 to optimize cleaning of the chuck 212.

Figure 9:
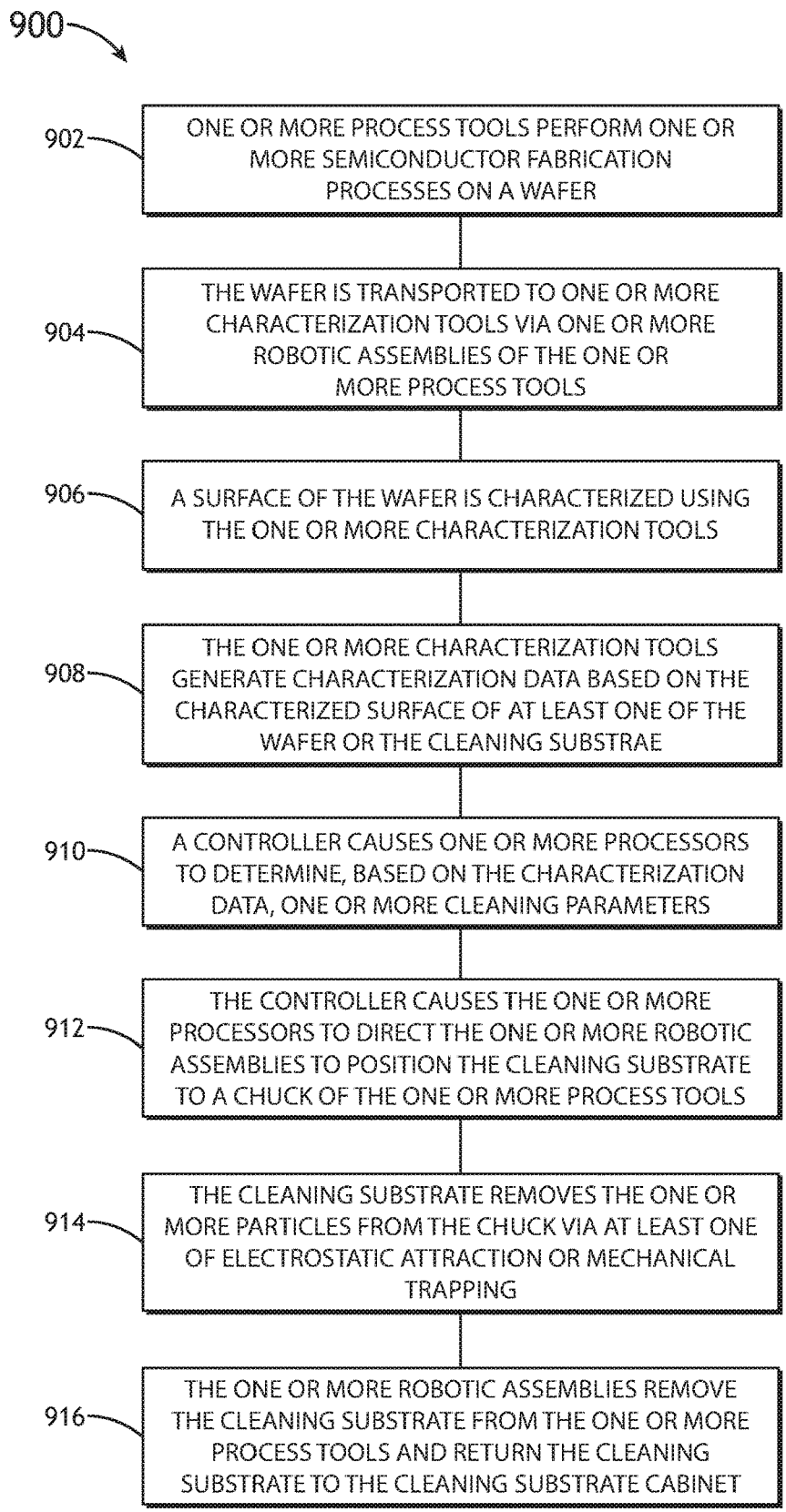
FIG. 9 illustrates a flow diagram depicting a method of characterization-triggered cleaning of the wafer chuck of the process tool, in accordance with one or more embodiments of the present disclosure.

FIG. 9 illustrates a flow diagram depicting a method 900 of characterization-triggered cleaning of the wafer chuck 212 of the process tool 100, in accordance with one or more embodiments of the present disclosure. It is noted herein that the steps of method 900 may be implemented all or in part by system 600. It is further recognized, however, that the method 900 is not limited to the system 600 in that additional or alternative system-level embodiments may carry out all or part of the steps of method 900.

In step 902, the one or more process tools 100 of the system 600 perform one or more semiconductor fabrication processes on the wafer 210. The wafer 210 may deposit the one or more particles 214 onto the chuck 212 during the one or more semiconductor fabrication processes. Further, one or more walls of the process chamber 102 of the process tool 100 may deposit the one or more particles 214 onto the chuck 212.

In step 904, at least one of the wafer 210 or the cleaning substrate 216 is transported (e.g., delivered) to the one or more characterization tools 604 of the system 600 via the one or more robotic assemblies of the processing tool 100. For example, the cleaning substrate 216 may be transported to at least one of the one or more inspection tools or the one or more particle review tools. By way of another example, the wafer 210 may be transported to at least one of the one or more inspection tools or the one or more particle review tools.

In step 906, a surface of at least one of the wafer 210 or the cleaning substrate is characterized using the one or more characterization tools 604 of the system 600. In another embodiment, the one or more characterization tools 604 includes one or more inspection tools. For example, a bottom side of at least one of the wafer 210 or the cleaning substrate may be inspected using the one or more inspection tools. By way of another example, a top side of at least one of the wafer 210 or the cleaning substrate 216 may be inspected using the one or more inspection tools. In another embodiment, the one or more characterization tools 605 includes one or more particle view tools. For example, a bottom side of at least one of the wafer 210 or the cleaning substrate 216 may be reviewed using the one or more particle review tools. By way of another example, a top side of at least one of the wafer 210 or the cleaning substrate 216 may be reviewed using the one or more particle review tools.

In step 908, the one or more characterization tools 604 generate characterization data (e.g., inspection data or particle review data) based on the inspection or review of the surface of at least one of the wafer 210 or cleaning substrate. For example, the one or more characterization tools 604 may generate inspection data based on the inspection of a surface of at least one of the wafer 210 or the cleaning substrate using the one or more inspection tools. By way of another example, the one or more characterization tools 604 may generate particle review data based on the review of a surface of at least one of the wafer 210 or the cleaning substrate. In another embodiment, the one or more characterization tools 604 are communicatively coupled with the controller 602, such that the one or more processors of the controller 602 receive the characterization data (e.g., inspection data or particle review data) from the one or more characterization tools 604. The characterization data (e.g., inspection data) may include information about the location, size, and materials of the one or more particles 214 on the surface 303 of the wafer 210 or the cleaning substrate 216.

In step 910, the controller 602 causes the one or more processors to determine, based on the characterization data (e.g., inspection data or particle review data), one or more cleaning parameters. In another embodiment, the controller 602 receives the characterization data (e.g., inspection data or particle review data) from the one or more characterization tools 604 and causes the one or more processors to begin one or more cleaning parameters. The one or more cleaning parameters may include at least one of preparation of the cleaning substrate 216, commencement of a cleaning cycle, orientation of the cleaning substrate 216, or the like. For example, one or more processors of controller 602 may trigger the one or more process tools 100 to begin the cleaning process described in FIGS. 1 through 5. By way of another example, at least one of the inspection data or particle review data is used to determine the orientation of the cleaning substrate 216 for optimal cleaning performances. For instance, the one or more processors of the controller 602 may trigger the P/A module 108 of the handling device 106 to orient the cleaning substrate 216 in an optimal orientation based on at least one of the inspection data or the particle review data. By way of an additional example, at least one of the inspection data or the particle review data may be used to control one or more additional cleaning parameters in order to ensure that the process tool 100 optimally cleans the chuck 212.

In step 912, the controller 602 causes the one or more processors to direct the one or more robotic assemblies to position the cleaning substrate 216 to the chuck 212 of the process tool 100. For example, the robotic assembly 110 may transport (e.g., deliver) the cleaning substrate 216 to the robotic assembly 116 of the handling device 112. For instance, the robotic assembly 116 of the handling device 112 may insert the cleaning substrate 216 into the process chamber 102 of the process tool 100 once the gate 206 is open.

In step 914, the cleaning substrate 216 removes the one or more particles 214 from the chuck 212 via at least one of electrostatic attraction, mechanical trapping, or the like.

In step 916, the one or more robotic assemblies remove the cleaning substrate 216 from the process tool 100 and return the cleaning substrate 216 to the cleaning substrate cabinet 120. For example, the robotic assembly 116 may remove the cleaning substrate 216 from the process chamber 102 of the process tool 100 and insert the cleaning substrate 216 into the handling device 114. By way of another example, the robotic assembly 110 may remove the cleaning substrate 216 from the handling device 114 and return the cleaning substrate to the cleaning substrate cabinet 120.

It is noted herein that the one or more inspection tools and/or the one or more particle review tools of system 600 may perform a single function or multiple functions. For example, a first inspection tool may be configured to inspect a surface of the wafer 210, while a second inspection tool may be configured to inspect a surface of the cleaning substrate 216. By way of another example, an inspection tool may be configured to inspect a surface of the wafer 210 and a surface of the cleaning substrate 216. Further example, a first review tool may be configured to review a surface of the wafer 210, while a second particle tool may be configured to review a surface of the cleaning substrate 216. By way of another example, a particle review tool may be configured to review a surface of the wafer 210 and a surface of the cleaning substrate 216.

Figure 10:
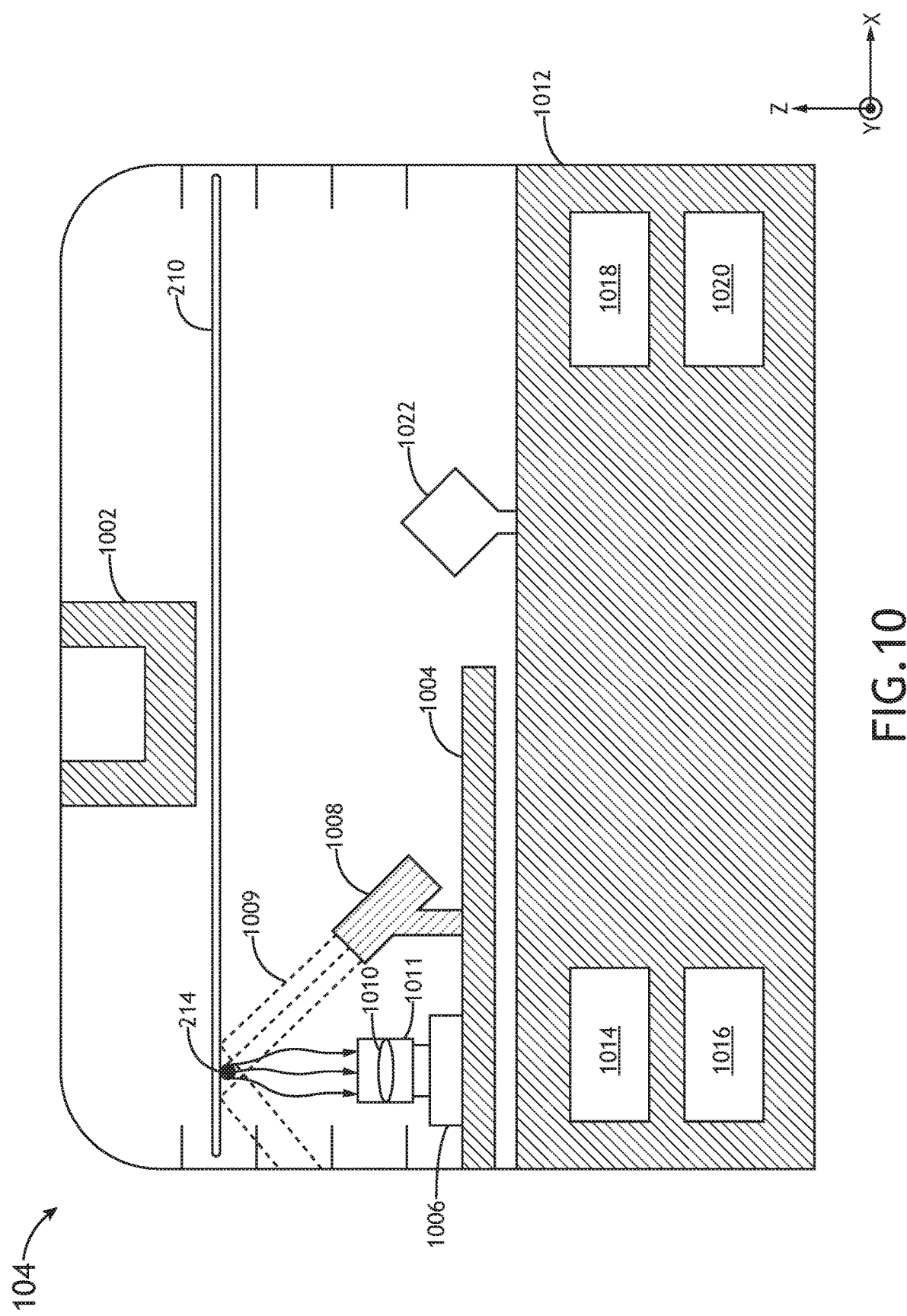
FIG. 10 illustrates a simplified schematic view of an exemplary wafer transport device, in accordance with one or more embodiments of the present disclosure.
Figure 11:
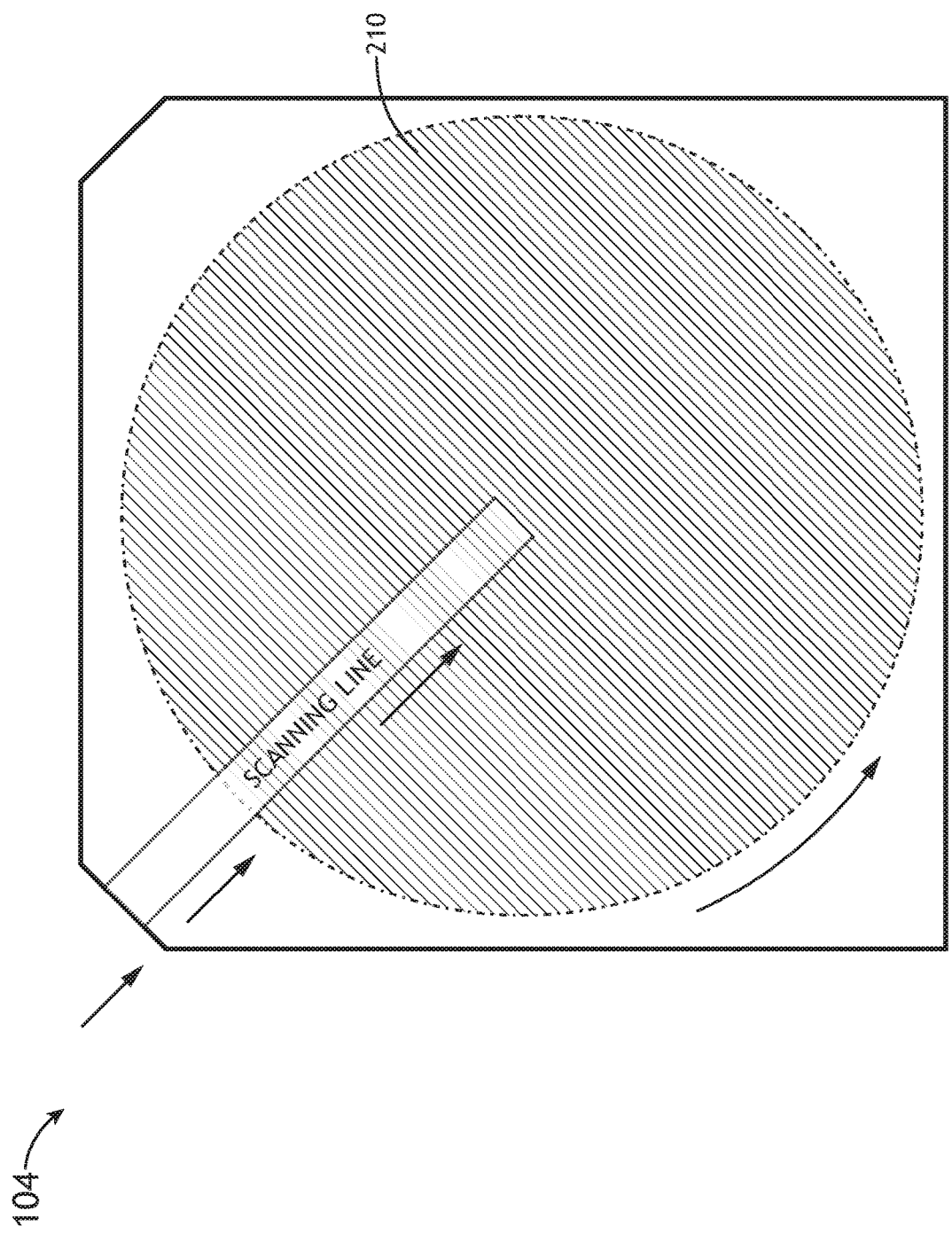
FIG. 11 illustrates a simplified top view of an exemplary wafer transport device, in accordance with one or more embodiments of the present disclosure.

FIG. 10 illustrates a simple schematic of a wafer transport device 104, in accordance with one or more embodiments of the present disclosure. FIG. 11 illustrates a simple top view of the wafer transport device 104, in accordance with one or more embodiments of the present disclosure.

In one embodiment, the wafer transport device 104 includes an imaging system 1006 arranged to detect one or more particles 214 on the wafer 210. In another embodiment, the imaging system 1006 includes a light source 1008 configured to produce a collimated beam of light. For example, the wafer transport device 104 may include a LED projector 1008 configured to produce the collimated beam of light. In another embodiment, the optics of the imaging system 1006 are configured to direct the collimated beam of light 1009 onto the surface of the wafer 210, whereby illumination is reflected, scattered, diffracted, or emitted from one or more particles 214 or the wafer 210.

In another embodiment, the imaging system 1006 includes an objective lens 1010 configured to collect the light 1009 emanating (e.g., reflected, scattered, diffracted, or emitted) from the particle 214. In another embodiment, the imaging system 1006 includes a detector 1011 (e.g., CCD detector). For example, the imaging system 1006 and the detector 1011 of the imaging system 1006 may be arranged in a dark field configuration. For instance, the dark field imaging may detect the one or more particles 214 axially or out of the lens. For instance, the dark field imaging may detect the one or more particles 214 having a dimension of 0-1.0 μm. It is noted herein that the objective lens 1010 may be any distance from the wafer 210. For example, the objective lens 1010 may be 100 mm from a surface of the wafer 210.

In one embodiment, the wafer transport device 104 includes a rotational stage 1002 configured to rotate the wafer 210 about the z-axis (e.g., up and down). For example, the rotational stage 1002 may include a rotational stage configured to rotate the wafer about the z-axis such that the one or more particles 214 are ready for imaging. In another embodiment, the wafer transport device 104 includes a linear stage 1004 configured to scan a surface (e.g., top side or bottom side) of the wafer 210. For example, the linear stage 1004 may be configured to translate the imaging system 1006 along the surface of the wafer 210 in order to scan a bottom side of the wafer 210 to detect the one or more particles 214. Utilizing the rotational stage 1002 and the linear stage 1004, the entire wafer 210 may be scanned. For example, as shown in FIG. 11, the rotational mechanism 1002 may rotate the wafer 210 a select distance such that linear stage 1004 may translate the imaging system 1006 along a scanning line. In this regard, the rotational mechanism 1002 may rotate the wafer 210 until the entire wafer 210 is scanned by the imaging system 1006.

In another embodiment, the wafer transport device 104 includes a main module 1012. In another embodiment, the main module includes a power source 1014 configured to charge the cleaning substrate 216 before each activation. It is noted herein that the power source 306 (discussed in FIG. 3B) may share one or more components with the power source 1014 of FIG. 10. In another embodiment, the main module 1012 includes a charging mechanism 1020 configured to provide power to the wafer transport device 104. The charging mechanism 1020 may include any charging mechanism known in the art including, but not limited to, a battery. It is noted herein that the power source 1014 and the charging mechanism 1020 may share one or more components.

In another embodiment the main module 1012 includes a cleaning mechanism 1016 (e.g., the cleaning assembly 300) configured to remove the one or more particles 214 using electrostatic fields. For example, the wafer transport device 104 may include an electrostatic field generator 1022 such that the cleaning substrate 216 may remove the one or more particles 214 using electrostatic fields.

In another embodiment, the main module 1012 includes a computing engine 1018 (e.g., one or more processors) configured to at least one of collect, process, or transmit data. For example, the computing engine 1018 (e.g., one or more processors) may be configured to perform the image processing. By way of another example, the computing engine 1018 (e.g., one or more processors) may be configured to perform one or more algorithms. The data may include one or more characteristics of the particle 214 and/or the surface of the wafer 210. For example, the data may include information about the size, location, material, or the like of the particle 214 The computing engine (e.g., one or more processors) may include any computing engine known in the art including, but not limited to, a microprocessor.

One skilled in the art will recognize that the herein described components, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, devices, and objects should not be taken as limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A cleaning assembly comprising:
   a substrate, wherein one or more patterns are formed on a bottom side of the substrate, wherein one or more structures within the one or more patterns attract one or more particles from a conductive chuck via at least electrostatic attraction when the substrate is positioned on the conductive chuck;
   one or more batteries; and
   a conductor element attached to a top side of the substrate, wherein the one or more batteries are electrically coupled to the conductor element,
   wherein the one or more batteries are configured to establish an electric field between the conductor element and the conductive chuck to enhance electrostatic-based uptake of charged particles from the conductive chuck.

2. The cleaning assembly of claim 1, wherein the substrate comprises a ceramic wafer.

3. The cleaning assembly of claim 1, wherein the substrate is shaped as a semiconductor wafer.

4. The cleaning assembly of claim 1, wherein the one or more structures within the one or more patterns are formed with carbon nanotubes (CNTs).

5. The cleaning assembly of claim 1, wherein the substrate is configured for manipulation via a handling device.

6. The cleaning assembly of claim 1, wherein the substrate includes a plurality of pattern types, wherein each pattern type is configured for attracting particles of different size.

7. The cleaning assembly of claim 1, wherein the electrostatic attraction is caused by Van der Waals forces.

8. The cleaning assembly of claim 1, further comprising a ground connection, wherein the ground connection is configured to ground the conductive chuck.

9. The cleaning assembly of claim 8, wherein the one or more batteries are configured to establish an electric field between 0.1 and 5 kV between the conductor element and the conductive chuck to enhance electrostatic-based uptake of charged particles from the conductive chuck.

10. The cleaning assembly of claim 1, wherein the substrate includes one or more reservoirs.

11. The cleaning assembly of claim 10, wherein the one or more reservoirs are configured to carry one or more chemical reactants.

12. The cleaning assembly of claim 11, wherein the substrate includes one or more valves for releasing the one or more chemical reactants from the one or more reservoirs onto the conductive chuck.

13. The cleaning assembly of claim 12, wherein the one or more valves comprise one or more mechanical valves configured to open when the substrate is positioned on the conductive chuck.

14. The cleaning assembly of claim 11, wherein the one or more reservoirs are configured to release the one or more chemical reactants upon exposure to a thermal impact.

15. The cleaning assembly of claim 14, wherein the one or more reservoirs include one or more valves activatable by a shape memory alloy actuator, wherein the shape memory alloy actuator is configured to open the one or more valves based on a temperature change of the shape memory alloy actuator.

16. The cleaning assembly of claim 1, wherein the substrate is mountable in a cleaning substrate cabinet, wherein the substrate is deliverable to a process chamber from the cleaning substrate cabinet via a handling device.

17. A system comprising:
a cleaning substrate cabinet, wherein the cleaning substrate cabinet is configured to store a cleaning substrate, wherein one or more patterns are formed on a bottom side of the cleaning substrate, wherein one or more structures within the one or more patterns attract one or more particles from a conductive chuck via at least electrostatic attraction or mechanical trapping when the cleaning substrate is positioned on the conductive chuck, wherein the cleaning substrate comprises one or more batteries; and a conductor element attached to a top side of the substrate, wherein the one or more batteries are electrically coupled to the conductor element, wherein the one or more batteries are configured to establish an electric field between the conductor element and the conductive chuck to enhance electrostatic-based uptake of charged particles from the conductive chuck.

18. A system comprising:
a process chamber, wherein the process chamber contains one or more wafer chucks; and
a handling device, wherein the handling device is configured to receive a cleaning substrate cabinet containing one or more cleaning substrates, wherein the handling device is further configured to translate the one or more cleaning substrates from the cleaning substrate cabinet to the one or more conductive chucks within the process chamber, wherein one or more patterns are formed on a bottom side of the one or more cleaning substrates, wherein one or more structures within the one or more patterns attract one or more particles from the one or more conductive chucks via at least electrostatic attraction when the one or more cleaning substrates are positioned on the one or more conductive chucks, wherein the cleaning substrate comprises one or more batteries; and a conductor element attached to a top side of the substrate, wherein the one or more batteries are electrically coupled to the conductor element, wherein the one or more batteries are configured to establish an electric field between the conductor element and the conductive chuck to enhance electrostatic-based uptake of charged particles from the conductive chuck.

\* \* \* \* \*